United States Patent
Deines et al.

(10) Patent No.: US 11,351,599 B2
(45) Date of Patent: Jun. 7, 2022

(54) MULTI-PIECE INTEGRATED CORE-SHELL STRUCTURE FOR MAKING CAST COMPONENT

(71) Applicant: General Electric Company, Schenectady, NY (US)

(72) Inventors: James Herbert Deines, Mason, OH (US); Michael John McCarren, Cininnati, OH (US); Brian Patrick Peterson, Madeira, OH (US); Brian David Przeslawski, Liberty Township, OH (US); Xi Yang, Mason, OH (US); Douglas Gerard Konitzer, West Chester, OH (US); Mark Willard Marusko, Cincinnati, OH (US); Gregory Terrence Garay, West Chester, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/827,117

(22) Filed: Mar. 23, 2020

(65) Prior Publication Data

US 2020/0222978 A1    Jul. 16, 2020

Related U.S. Application Data

(63) Continuation of application No. 15/377,711, filed on Dec. 13, 2016, now abandoned, and a continuation of
(Continued)

(51) Int. Cl.
*B22C 9/10*     (2006.01)
*B22C 9/02*     (2006.01)
(Continued)

(52) U.S. Cl.
CPC ............... *B22D 25/02* (2013.01); *B22C 1/22* (2013.01); *B22C 9/02* (2013.01); *B22C 9/10* (2013.01);
(Continued)

(58) Field of Classification Search
CPC .... B22C 1/22; B22C 9/02; B22C 9/10; B22C 9/103; B22C 9/108; B22C 9/12;
(Continued)

(56) References Cited

U.S. PATENT DOCUMENTS 3,628,885 A    12/1971  Sidenstick et al.
4,078,761 A     3/1978  Thompson
(Continued)

FOREIGN PATENT DOCUMENTS

CN        1607052 A     4/2005
CN      101377132 A     3/2009
(Continued)

OTHER PUBLICATIONS

International Search Report and Written Opinion issued in connection with corresponding PCT Application No. PCT/US2017/056715 dated Jan. 4, 2018.
(Continued)

*Primary Examiner* — Kevin P Kerns
(74) *Attorney, Agent, or Firm* — Dority & Manning, P.A.

(57) ABSTRACT

Partial integrated core-shell investment casting molds that can be assembled into complete molds are provided herein. Each section of the partial mold may contain both a portion of a core and portion of a shell. Each section can then be assembled into a mold for casting of a metal part. The partial integrated core-shell investment casting molds and the complete molds may be provided with filament structures corresponding to cooling hole patterns on the surface of the turbine blade or the stator vane, which provides a leaching
(Continued)

pathway for the core portion after metal casting. Core filaments that can be used to supplement the leaching pathway, for example in a core tip portion of the mold are also provided herein.

36 Claims, 40 Drawing Sheets

Related U.S. Application Data application No. 15/377,673, filed on Dec. 13, 2016, now abandoned, and a continuation of application No. 15/377,728, filed on Dec. 13, 2016, now abandoned, and a continuation of application No. 15/377,746, filed on Dec. 13, 2016, now abandoned, and a continuation of application No. 15/377,783, filed on Dec. 13, 2016, now Pat. No. 10,807,154, and a continuation of application No. 15/377,766, filed on Dec. 13, 2016, now abandoned, and a continuation of application No. 15/377,759, filed on Dec. 13, 2016, now abandoned, and a continuation of application No. 15/377,796, filed on Dec. 13, 2016, now abandoned, and a continuation of application No. 15/377,787, filed on Dec. 16, 2016, now abandoned.

(51) Int. Cl.

| | | |
|---|---|---|
| *B22C 9/24* | (2006.01) | |
| *B22D 25/02* | (2006.01) | |
| *B22C 1/22* | (2006.01) | |
| *B22C 9/12* | (2006.01) | |
| *B22D 29/00* | (2006.01) | |
| *F01D 9/04* | (2006.01) | |
| *F01D 5/12* | (2006.01) | |
| *B22C 21/14* | (2006.01) | |
| *B22C 13/08* | (2006.01) | |
| *B29C 64/135* | (2017.01) | |
| *B28B 1/00* | (2006.01) | |
| *B29C 64/129* | (2017.01) | |
| *B22C 13/12* | (2006.01) | |
| *G03F 7/00* | (2006.01) | |
| *B29C 64/124* | (2017.01) | |
| *G03F 7/20* | (2006.01) | |

(52) U.S. Cl.
CPC .............. *B22C 9/103* (2013.01); *B22C 9/108* (2013.01); *B22C 9/12* (2013.01); *B22C 9/24* (2013.01); *B22C 13/08* (2013.01); *B22C 13/12* (2013.01); *B22C 21/14* (2013.01); *B22D 29/00* (2013.01); *B22D 29/001* (2013.01); *B22D 29/002* (2013.01); *B28B 1/001* (2013.01); *B29C 64/124* (2017.08); *B29C 64/129* (2017.08); *B29C 64/135* (2017.08); *F01D 5/12* (2013.01); *F01D 9/041* (2013.01); *G03F 7/00* (2013.01); *G03F 7/20* (2013.01); *F05D 2230/21* (2013.01); *Y02P 10/25* (2015.11)

(58) Field of Classification Search
CPC .......... B22C 9/24; B22C 13/08; B22C 13/12; B22C 21/14; B22D 25/02; B22D 29/00; B22D 29/001; B22D 29/002
USPC ................. 164/361, 365, 369, 519
See application file for complete search history.

(56) References Cited

U.S. PATENT DOCUMENTS

| | | | |
|---|---|---|---|
| 5,256,340 A | 10/1993 | Allison et al. | |
| 5,296,308 A | 3/1994 | Caccavale et al. | |
| 5,370,499 A | 12/1994 | Lee | |
| 5,387,380 A | 2/1995 | Cima et al. | |
| 5,545,003 A | 8/1996 | O'Connor et al. | |
| 5,853,044 A * | 12/1998 | Wheaton et al. | B22C 21/14 164/516 |
| 6,117,612 A | 9/2000 | Halloran et al. | |
| 6,347,660 B1 * | 2/2002 | Sikkenga et al. | B22C 7/026 164/137 |
| 6,595,749 B2 | 7/2003 | Lee et al. | |
| 6,805,535 B2 | 10/2004 | Tiemann | |
| 6,913,064 B2 | 7/2005 | Beals et al. | |
| 7,306,026 B2 | 12/2007 | Memmen | |
| 7,448,433 B2 | 11/2008 | Ortiz et al. | |
| 7,452,202 B2 | 11/2008 | Gram | |
| 7,527,475 B1 | 5/2009 | Liang | |
| 7,533,713 B2 | 5/2009 | Pfeifer et al. | |
| 7,610,946 B2 * | 11/2009 | Morris et al. | B22C 9/04 164/369 |
| 7,717,676 B2 | 5/2010 | Cunha et al. | |
| 7,753,104 B2 * | 7/2010 | Luczak et al. | B22C 21/14 164/516 |
| 8,066,052 B2 * | 11/2011 | Blair | B22C 21/14 164/44 |
| 8,506,836 B2 | 8/2013 | Szuromi et al. | |
| 8,641,807 B2 | 2/2014 | Thomas | |
| 8,851,151 B2 | 10/2014 | Frasier et al. | |
| 8,985,540 B1 | 3/2015 | Slesinksi | |
| 9,039,382 B2 | 5/2015 | Stapleton | |
| 9,079,357 B2 | 7/2015 | Ebert et al. | |
| 9,835,035 B2 * | 12/2017 | Mueller et al. | B22C 7/02 |
| 10,022,790 B2 * | 7/2018 | Lee et al. | F01D 5/186 |
| 10,399,270 B2 | 9/2019 | Xu et al. | |
| 2001/0024000 A1 | 9/2001 | Lee et al. | |
| 2005/0205232 A1 | 9/2005 | Wang et al. | |
| 2008/0006384 A1 | 1/2008 | Memmen | |
| 2008/0080979 A1 | 4/2008 | Brassfield et al. | |
| 2008/0135722 A1 | 6/2008 | Wang et al. | |
| 2009/0060714 A1 | 3/2009 | Moors | |
| 2010/0003619 A1 | 1/2010 | Das et al. | |
| 2010/0025001 A1 | 2/2010 | Lee et al. | |
| 2010/0028645 A1 | 2/2010 | Maguire et al. | |
| 2010/0068464 A1 | 3/2010 | Meyer | |
| 2010/0068465 A1 | 3/2010 | Su et al. | |
| 2011/0132562 A1 | 6/2011 | Merrill et al. | |
| 2011/0132563 A1 | 6/2011 | Merrill et al. | |
| 2011/0310370 A1 | 12/2011 | Rohner et al. | |
| 2012/0248657 A1 | 10/2012 | Ebert et al. | |
| 2013/0224423 A1 | 8/2013 | Mikulak et al. | |
| 2013/0333855 A1 | 12/2013 | Merrill et al. | |
| 2014/0079540 A1 | 3/2014 | Morris et al. | |
| 2014/0271129 A1 | 9/2014 | Mueller et al. | |
| 2014/0352562 A1 | 12/2014 | Raymond, Jr. | |
| 2015/0037601 A1 | 2/2015 | Blackmore | |
| 2015/0048209 A1 | 2/2015 | Hoyt et al. | |
| 2015/0064015 A1 | 3/2015 | Perez | |
| 2015/0068629 A1 | 3/2015 | Kottilingam et al. | |
| 2015/0076739 A1 | 3/2015 | Batchelder | |
| 2015/0090074 A1 | 4/2015 | Etter et al. | |
| 2015/0202683 A1 | 7/2015 | Bunker | |
| 2015/0209910 A1 | 7/2015 | Denney et al. | |
| 2015/0306657 A1 | 10/2015 | Frank | |
| 2015/0321249 A1 | 11/2015 | Shah et al. | |
| 2015/0321250 A1 | 11/2015 | Xu | |
| 2016/0038866 A1 | 2/2016 | Gibson et al. | |
| 2016/0059302 A1 | 3/2016 | McBrien et al. | |
| 2016/0221262 A1 | 8/2016 | Das et al. | |
| 2017/0087630 A1 | 3/2017 | Lee et al. | |
| 2018/0161852 A1 | 6/2018 | McCarren et al. | |
| 2018/0161853 A1 | 6/2018 | Deines et al. | |
| 2018/0161854 A1 | 6/2018 | Deines et al. | |
| 2018/0161855 A1 | 6/2018 | Deines et al. | |
| 2018/0161856 A1 | 6/2018 | Yang et al. | |

(56) References Cited

U.S. PATENT DOCUMENTS

| | | | |
|---|---|---|---|
| 2018/0161857 A1 | 6/2018 | Garay et al. |
| 2018/0161858 A1 | 6/2018 | Garay et al. |
| 2018/0161859 A1 | 6/2018 | Garay et al. |
| 2018/0161866 A1 | 6/2018 | Deines et al. |

FOREIGN PATENT DOCUMENTS

| | | | |
|---|---|---|---|
| CN | 102078924 A | 6/2011 |
| CN | 202291247 A | 7/2012 |
| CN | 102802834 A | 11/2012 |
| CN | 103008558 A | 4/2013 |
| DE | 10 2009 039 255 A1 | 3/2011 |
| EP | 1 616 642 A1 | 1/2006 |
| EP | 1 759 788 A2 | 3/2007 |
| EP | 2 359 959 A1 | 8/2011 |
| EP | 2 359 962 A2 | 8/2011 |
| EP | 2743451 A1 | 6/2014 |
| EP | 2853323 A2 | 4/2015 |
| EP | 2 992 982 A1 | 3/2016 |
| EP | 3290186 A1 | 3/2018 |
| JP | 2003/502159 A | 1/2003 |
| JP | 2007/061912 A | 3/2007 |
| JP | 2008/144760 A | 6/2008 |
| JP | 2013/512783 A | 4/2013 |
| JP | 2014/139428 A | 7/2014 |
| JP | 2014/208373 A | 11/2014 |
| JP | 2016/501139 A | 1/2016 |
| JP | 2015/516591 A | 6/2016 |
| JP | 2016/533905 A | 11/2016 |
| WO | 0032331 A1 | 6/2000 |
| WO | 00/51761 A1 | 9/2000 |
| WO | 2009/085654 A1 | 7/2009 |
| WO | 2010045950 A1 | 4/2010 |
| WO | 2015/021168 A1 | 2/2015 |
| WO | 2015/026535 A1 | 2/2015 |
| WO | 2015026535 A1 | 2/2015 |
| WO | 2015/053846 A2 | 4/2015 |
| WO | 2015/112885 A1 | 7/2015 |

OTHER PUBLICATIONS

International Search Report and Written Opinion issued in connection with corresponding PCT Application No. PCT/US2017/060178 dated Feb. 13, 2018.

Kumar, A. and Katukam, R., "30 Printing of Hollow Compounds," IJRET: International Journal of Research in Engineering and Technology, vol. 04, Issue 12, pp. 18-21 (Dec. 1, 2015).

International Search Report and Written Opinion issued in connection with corresponding PCT Application No. PCT/US2017/057831 dated Jan. 4, 2018.

International Search Report and Written Opinion issued in connection with corresponding PCT Application No. PCT/US2017/58549 dated Jan. 24, 2018.

Bae, C.J., "Integrally cored ceramic investment casting mold fabricated by ceramic stereolithography," Chapter 5, A dissertation submitted in partial fulfillment of the requirements for the degree of Doctor of Philosophy (Materials Science and Engineering), pp. 102-139 (Jan. 2, 2008).

International Search Report and Written Opinion issued in connection with corresponding PCT Application No. PCT/US2017/057945 dated Jan. 18, 2018.

"Advanced Filtration to Improve Single Crystal Casting Yield—Mikro Systems," National Energy Technology Laboratory, pp. 1-4 (Aug. 2013).

International Search Report and Written Opinion issued in connection with corresponding PCT Application No. PCT/US2017/060165 dated Jan. 19, 2018.

International Search Report and Written Opinion issued in connection with corresponding PCT Application No. PCT/US2017/057944 dated Jan. 18, 2018.

International Search Report and Written Opinion issued in connection with corresponding PCT Application No. PCT/US2017/060158 dated Feb. 9, 2018.

International Search Report and Written Opinion issued in connection with corresponding PCT Application No. PCT/US2017/057874 dated Jan. 4, 2018.

European Office Action Corresponding to Application No. 17791845 dated Apr. 30, 2020.

Chinese Search Report and Office Action Corresponding to Application No. 201780077173 dated Jun. 3, 2020.

Machine Translated Japanese Office Action Corresponding to Application No. 20195331747 dated Aug. 28, 2020.

European Office Action Corresponding to Application No. 17791845 dated Nov. 30, 2020.

Machine Translated Japanese Office Action Corresponding to Application No. 20195331747 dated Feb. 10, 2021.

* cited by examiner

MULTI-PIECE INTEGRATED CORE-SHELL STRUCTURE FOR MAKING CAST COMPONENT

CROSS-REFERENCE TO RELATED APPLICATIONS

This application is a continuation of Ser. No. 15/377,796, filed Dec. 13, 2016, Ser. No. 15/377,746, filed Dec. 13, 2016, Ser. No. 15/377,673, filed Dec. 13, 2016, Ser. No. 15/377,728 filed Dec. 13, 2016, Ser. No. 15/377,711, filed Dec. 13, 2016, Ser. No. 15/377,759, filed Dec. 13, 2016, Ser. No. 15/377,787, filed Dec. 13, 2016, U.S. Pat. No. 10,807,154, filed Dec. 13, 2016, and Ser. No. 15/377,766 filed Dec. 13, 2016, now abandoned, which are incorporated herein by reference in their entirety.

INTRODUCTION

The present disclosure generally relates to graded investment casting two piece core-shell mold components and processes utilizing these components. The two piece core-shell mold is assembled from a partial mold including a first core and shell portion. The two piece core-shell mold is assembled by attaching the first core and shell portion to at least a second core and shell portion of a second partial mold. The two piece core-shell mold made in accordance with the present invention may also include integrated ceramic filaments between the core and shell of the mold that can be utilized to form holes, i.e., effusion cooling holes, in the cast component made from these two-piece molds. The use of sufficient ceramic filaments between core and shell to both locate and provide leaching pathways for the core serpentine also enables the elimination of ball braze chutes. Ceramic filaments between the tip plenum core and the shell may also be provided to support a floating tip plenum, eliminating the need for traditional tip pins, and their subsequent closure by brazing. The integrated core-shell molds provide useful properties in casting operations, such as in the casting of superalloys used to make turbine blades and stator vanes for jet aircraft engines or power generation turbine components.

BACKGROUND

Many modern engines and next generation turbine engines require components and parts having intricate and complex geometries, which require new types of materials and manufacturing techniques. Conventional techniques for manufacturing engine parts and components involve the laborious process of investment or lost-wax casting. One example of investment casting involves the manufacture of a typical rotor blade used in a gas turbine engine. A turbine blade typically includes hollow airfoils that have radial channels extending along the span of a blade having at least one or more inlets for receiving pressurized cooling air during operation in the engine. The various cooling passages in a blade typically include a serpentine channel disposed in the middle of the airfoil between the leading and trailing edges. The airfoil typically includes inlets extending through the blade for receiving pressurized cooling air, which include local features such as short turbulator ribs or pins for increasing the heat transfer between the heated sidewalls of the airfoil and the internal cooling air.

The manufacture of these turbine blades, typically from high strength, superalloy metal materials, involves numerous steps shown in FIG. 1. First, a precision ceramic core is manufactured to conform to the intricate cooling passages desired inside the turbine blade. A precision die or mold is also created which defines the precise 3-D external surface of the turbine blade including its airfoil, platform, and integral dovetail. A schematic view of such a mold structure is shown in FIG. 2. The ceramic core 200 is assembled inside two die halves which form a space or void therebetween that defines the resulting metal portions of the blade. Wax is injected into the assembled dies to fill the void and surround the ceramic core encapsulated therein. The two die halves are split apart and removed from the molded wax. The molded wax has the precise configuration of the desired blade and is then coated with a ceramic material to form a surrounding ceramic shell. Then, the wax is melted and removed from the shell 202 leaving a corresponding void or space 201 between the ceramic shell 202 and the internal ceramic core 200 and tip plenum 204. Molten superalloy metal is then poured into the shell to fill the void therein and again encapsulate the ceramic core 200 and tip plenum 204 contained in the shell 202. The molten metal is cooled and solidifies, and then the external shell 202 and internal core 200 and tip plenum 204 are suitably removed leaving behind the desired metallic turbine blade in which the internal cooling passages are found. In order to provide a pathway for removing ceramic core material via a leaching process, a ball chute 203 and tip pins 205 are provided, which upon leaching form a ball chute and tip holes within the turbine blade that must subsequently be brazed shut.

The cast turbine blade may then undergo additional post-casting modifications, such as but not limited to drilling of suitable rows of film cooling holes through the sidewalls of the airfoil as desired for providing outlets for the internally channeled cooling air which then forms a protective cooling air film or blanket over the external surface of the airfoil during operation in the gas turbine engine. After the turbine blade is removed from the ceramic mold, the ball chute 203 of the ceramic core 200 forms a passageway that is later welded shut to provide the desired pathway of air through the internal voids of the cast turbine blade. However, these post-casting modifications are limited and given the ever increasing complexity of turbine engines and the recognized efficiencies of certain cooling circuits inside turbine blades, more complicated and intricate internal geometries are required. While investment casting is capable of manufacturing these parts, positional precision and intricate internal geometries become more complex to manufacture using these conventional manufacturing processes. Accordingly, it is desired to provide an improved casting method for three dimensional components having intricate internal voids.

Methods for using 3-D printing to produce a ceramic core-shell mold are described in U.S. Pat. No. 8,851,151 assigned to Rolls-Royce Corporation. The methods for making the molds include powder bed ceramic processes such as disclosed in U.S. Pat. No. 5,387,380 assigned to Massachusetts Institute of Technology, and selective laser activation (SLA) such as disclosed in U.S. Pat. No. 5,256,340 assigned to 3D Systems, Inc. The ceramic core-shell molds according to the '151 patent are limited by the printing resolution capabilities of these processes. As shown in FIG. 3, the core portion 301 and shell portion 302 of the integrated core-shell mold is held together via a series of tie structures 303 provided at the bottom edge of the mold. Cooling passages are proposed in the '151 patent that include staggered vertical cavities joined by short cylinders, the length of which is nearly the same as its diameter. A superalloy turbine blade is then formed in the core-shell mold using known techniques disclosed in the '151 patent, and incorporated herein by reference. After a turbine blade is cast in one of these core-shell molds, the mold is removed to reveal a cast superalloy turbine blade.

There remains a need to prepare ceramic core-shell molds produced using higher resolution methods that are capable of providing fine detail cast features in the end-product of the casting process.

SUMMARY

The present invention relates to a novel casting mold that is formed as a two piece core-shell mold consisting of a first ceramic mold portion comprising a first shell portion and optionally a first core portion and a second ceramic mold portion comprising a second shell portion and optionally a second core portion, the first ceramic mold portion being adapted to interface with the second ceramic mold portion to form a two piece ceramic mold comprising a cavity between the first and/or second core portions and the first and second shell portions, the cavity adapted to define a cast component upon casting and removal of the ceramic mold. The first and/or second ceramic mold portion may be provided with at least one attachment point to facilitate assembly into a complete core-shell mold. Non-limiting examples of suitable attachment points include, for example, an interlocking arrangement, such as for example a tongue and groove or dovetail type attachment. Another non-limiting example of a suitable attachment point is a rabbet joint.

DETAILED DESCRIPTION

Figure 1:
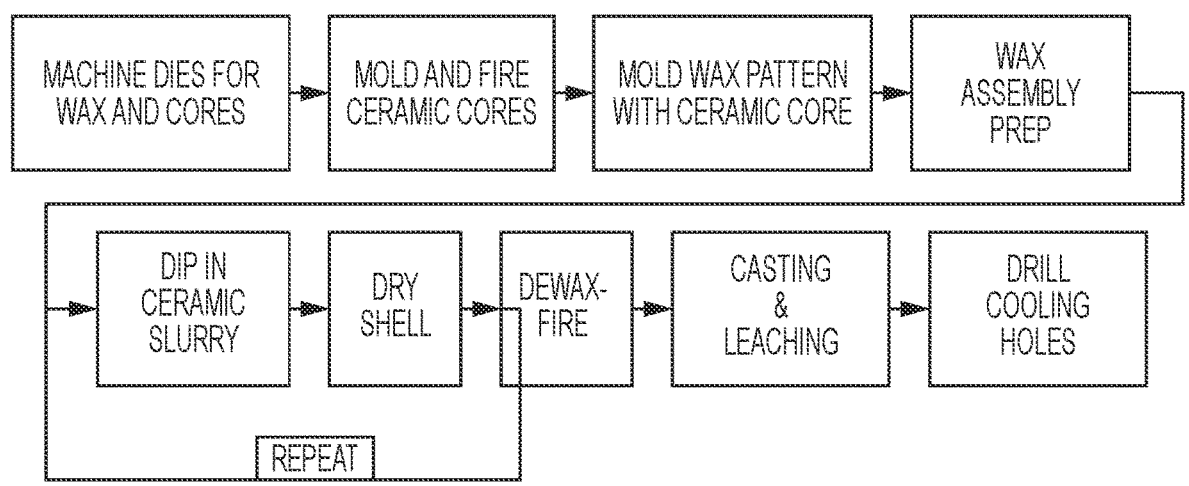
FIG. 1 is a flow diagram showing the steps for conventional investment casting.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. For example, the present invention provides a preferred method for making cast metal parts, and preferably those cast metal parts used in the manufacture of jet aircraft engines. Specifically, the production of single crystal, nickel-based superalloy cast parts such as turbine blades, vanes, and shroud components can be advantageously produced in accordance with this invention. However, other cast metal components may be prepared using the techniques and integrated ceramic molds of the present invention.

The present inventors recognized that prior processes known for making integrated core-shell molds lacked the fine resolution capability necessary to print filaments extending between the core and shell portion of the mold of sufficiently small size and quantity to result in effusion cooling holes in the finished turbine blade or stator vane. In the case of earlier powder bed processes, such as disclosed in U.S. Pat. No. 5,387,380 assigned to Massachusetts Institute of Technology, the action of the powder bed recoater arm precludes formation of sufficiently fine filaments extending between the core and shell to provide an effusion cooling hole pattern in the cast part. Other known techniques such as selective laser activation (SLA) such as disclosed in U.S. Pat. No. 5,256,340 assigned to 3D Systems, Inc. that employ a top-down irradiation technique may be utilized in producing an integrated core-shell mold in accordance with the present invention. However, the available printing resolution of these systems significantly limits the ability to make filaments of sufficiently small size to serve as effective cooling holes in the cast final product. In particular, these prior processes and systems known for making integrated core-shell molds are unable to make cooling holes in a cast final product having one or more outer portions or overhangs, specifically in locations that are proximal to these outer portions or overhangs.

The present inventors have found that the integrated core-shell mold of the present invention can be manufactured using direct light processing (DLP). DLP differs from the above discussed powder bed and SLA processes in that the light curing of the polymer occurs through a window at the bottom of a resin tank that projects light upon a build platform that is raised as the process is conducted. With DLP an entire layer of cured polymer is produced simultaneously, and the need to scan a pattern using a laser is eliminated. Further, the polymerization occurs between the underlying window and the last cured layer of the object being built. The underlying window provides support allowing thin filaments of material to be produced without the need for a separate support structure. In other words, producing a thin filament of material bridging two portions of the build object is difficult and was typically avoided in the prior art. For example, the '151 patent discussed above in the background section of this application used vertical plate structures connected with short cylinders, the length of which was on the order of their diameter. Staggered vertical cavities are necessitated by the fact that the powder bed and SLA techniques disclosed in the '151 patent require vertically supported ceramic structures and the techniques are incapable of reliably producing filaments. In addition, the available resolution within a powder bed is on the order of ⅛" (3.2 mm), resulting in a minimum feature cross sectional dimension on the order of 8 mm$^2$, making the production of traditional cooling holes impracticable. For example, round cooling holes generally have a diameter of less than 2 mm corresponding to a cooling hole area below 3.2 mm$^2$. Production of a hole of such dimensions requires a resolution far below the size of the actual hole given the need to produce the hole from several voxels. This resolution is simply not available in a powder bed process. Similarly, stereolithography is limited in its ability to produce such filaments due to lack of support and resolution problems associated with laser scattering. But the fact that DLP exposes the entire length of the filament and supports it between the window and the build plate enables producing sufficiently thin filaments spanning the entire length between the core and shell to form a ceramic object having the desired cooling hole pattern. Although powder bed and SLA may be used to produce filaments, their ability to produce sufficiently fine filaments as discussed above is limited.

One suitable DLP process is disclosed in U.S. Pat. No. 9,079,357 assigned to Ivoclar Vivadent AG and Technische Universitat Wien, as well as WO 2010/045950 A1 and US 2011310370, each of which are hereby incorporated by reference and discussed below with reference to FIGS. 4-8. The apparatus includes a tank 404 having at least one translucent bottom portion 406 covering at least a portion of the exposure unit 410. The exposure unit 410 comprises a light source and modulator with which the intensity can be adjusted position-selectively under the control of a control unit, in order to produce an exposure field on the tank bottom 406 with the geometry desired for the layer currently to be formed. As an alternative, a laser may be used in the exposure unit, the light beam of which successively scans the exposure field with the desired intensity pattern by means of a mobile mirror, which is controlled by a control unit.

Opposite the exposure unit 410, a production platform 412 is provided above the tank 404; it is supported by a lifting mechanism (not shown) so that it is held in a height-adjustable way over the tank bottom 406 in the region above the exposure unit 410. The production platform 412 may likewise be transparent or translucent in order that light can be shone in by a further exposure unit above the production platform in such a way that, at least when forming the first layer on the lower side of the production platform 412, it can also be exposed from above so that the layer cured first on the production platform adheres thereto with even greater reliability.

The tank 404 contains a filling of highly viscous photopolymerizable material 420. The material level of the filling is much higher than the thickness of the layers which are intended to be defined for position-selective exposure. In order to define a layer of photopolymerizable material, the following procedure is adopted. The production platform 412 is lowered by the lifting mechanism in a controlled way so that (before the first exposure step) its lower side is immersed in the filling of photopolymerizable material 420 and approaches the tank bottom 406 to such an extent that precisely the desired layer thickness Δ (see FIG. 5) remains between the lower side of the production platform 412 and the tank bottom 406. During this immersion process, photopolymerizable material is displaced from the gap between the lower side of the production platform 412 and the tank bottom 406. After the layer thickness Δ has been set, the desired position-selective layer exposure is carried out for this layer, in order to cure it in the desired shape. Particularly when forming the first layer, exposure from above may also take place through the transparent or translucent production platform 412, so that reliable and complete curing takes place particularly in the contact region between the lower side of the production platform 412 and the photopolymerizable material, and therefore good adhesion of the first layer to the production platform 412 is ensured. After the layer has been formed, the production platform is raised again by means of the lifting mechanism.

These steps are subsequently repeated several times, the distance from the lower side of the layer 422 formed last to the tank bottom 406 respectively being set to the desired layer thickness Δ and the next layer thereupon being cured position-selectively in the desired way.

Figure 6:
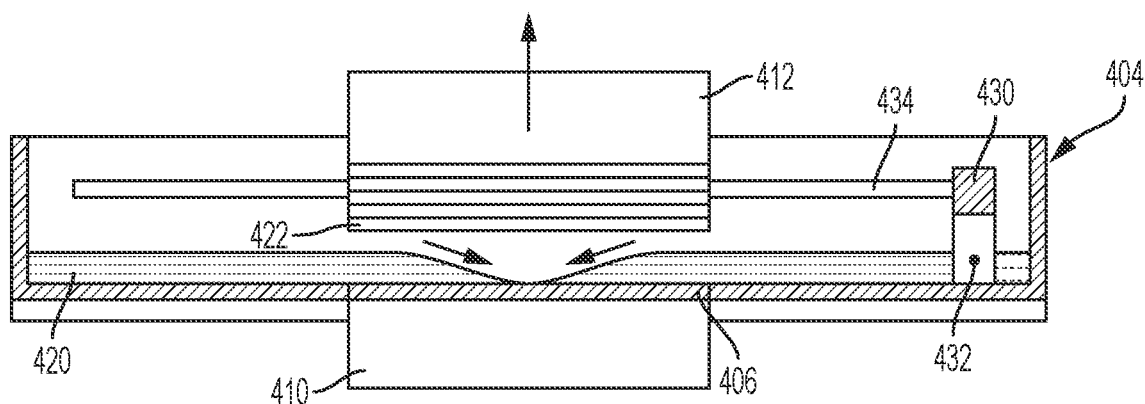

After the production platform 412 has been raised following an exposure step, there is a material deficit in the exposed region as indicated in FIG. 6. This is because after curing the layer set with the thickness Δ, the material of this layer is cured and raised with the production platform and the part of the shaped body already formed thereon. The photopolymerizable material therefore missing between the lower side of the already formed shaped body part and the tank bottom 406 must be filled from the filling of photopolymerizable material 420 from the region surrounding the exposed region. Owing to the high viscosity of the material, however, it does not flow by itself back into the exposed region between the lower side of the shaped body part and the tank bottom, so that material depressions or "holes" can remain here.

Figure 7:
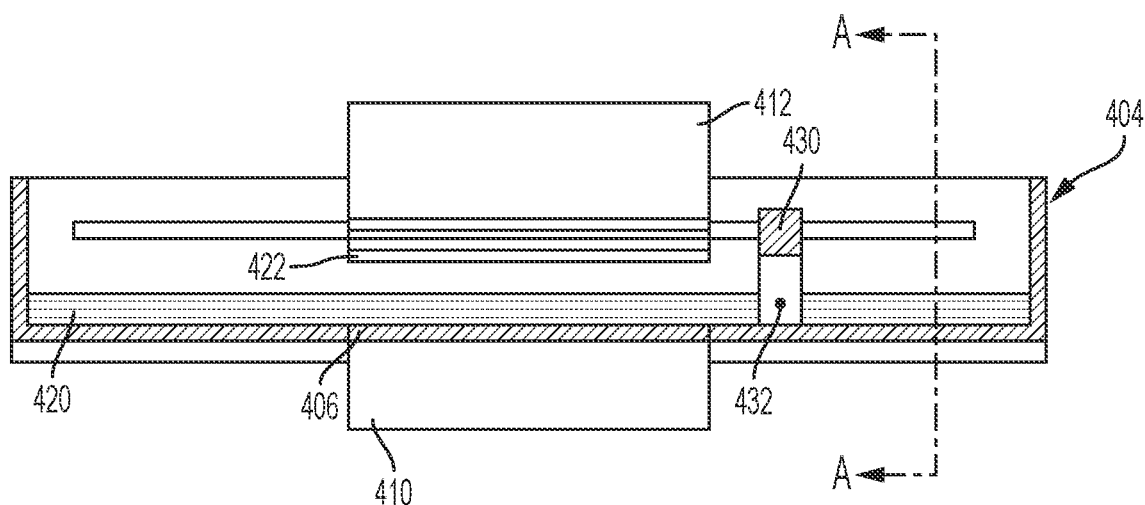

In order to replenish the exposure region with photopolymerizable material, an elongate mixing element 432 is moved through the filling of photopolymerizable material 420 in the tank. In the exemplary embodiment represented in FIGS. 4 to 8, the mixing element 432 comprises an elongate wire which is tensioned between two support arms 430 mounted movably on the side walls of the tank 404. The support arms 430 may be mounted movably in guide slots 434 in the side walls of the tank 404, so that the wire 432 tensioned between the support arms 430 can be moved relative to the tank 404, parallel to the tank bottom 406, by moving the support arms 430 in the guide slots 434. The elongate mixing element 432 has dimensions, and its movement is guided relative to the tank bottom, such that the upper edge of the elongate mixing element 432 remains below the material level of the filling of photopolymerizable material 420 in the tank outside the exposed region. As can be seen in the sectional view of FIG. 8, the mixing element 432 is below the material level in the tank over the entire length of the wire, and only the support arms 430 protrude beyond the material level in the tank. The effect of arranging the elongate mixing element below the material level in the tank 404 is not that the elongate mixing element 432 substantially moves material in front of it during its movement relative to the tank through the exposed region, but rather this material flows over the mixing element 432 while executing a slight upward movement. The movement of the mixing element 432 from the position shown in FIG. 6, to, for example, a new position, is shown in FIG. 7. It has been found that by this type of action on the photopolymerizable material in the tank, the material is effectively stimulated to flow back into the material-depleted exposed region between the production platform 412 and the exposure unit 410.

Figure 8:
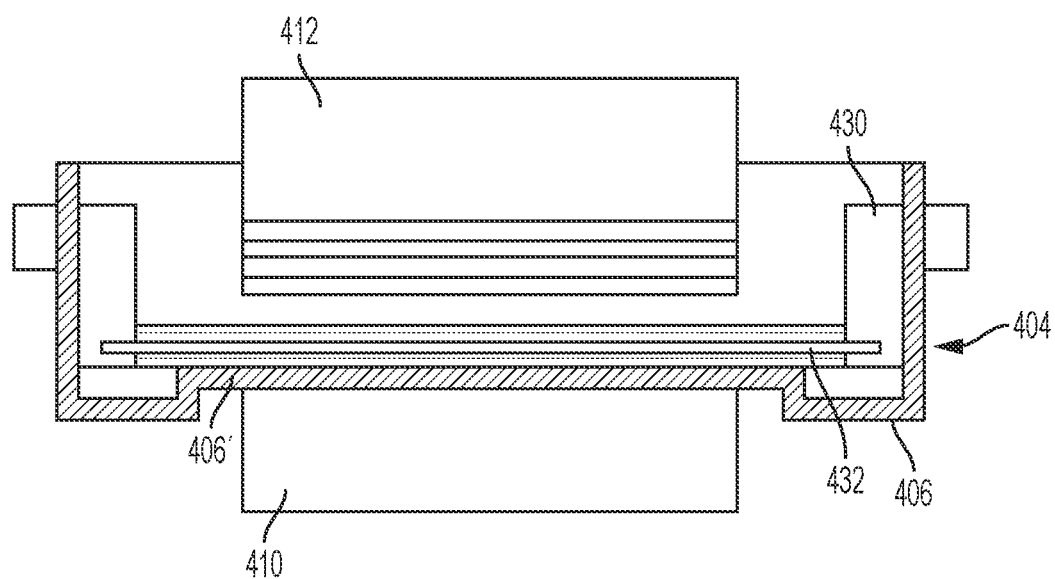
FIG. 8 shows a schematic sectional view along the line A-A of FIG. 7.

The movement of the elongate mixing element 432 relative to the tank may firstly, with a stationary tank 404, be carried out by a linear drive which moves the support arms 430 along the guide slots 434 in order to achieve the desired movement of the elongate mixing element 432 through the exposed region between the production platform 412 and the exposure unit 410. As shown in FIG. 8, the tank bottom 406 has recesses 406' on both sides. The support arms 430 project with their lower ends into these recesses 406'. This makes it possible for the elongate mixing element 432 to be held at the height of the tank bottom 406, without interfering with the movement of the lower ends of the support arms 430 through the tank bottom 406.

Other alternative methods of DLP may be used to prepare the integrated core-shell molds of the present invention. For example, the tank may be positioned on a rotatable platform. When the workpiece is withdrawn from the viscous polymer between successive build steps, the tank may be rotated relative to the platform and light source to provide a fresh layer of viscous polymer in which to dip the build platform for building successive layers.

Figure 9:
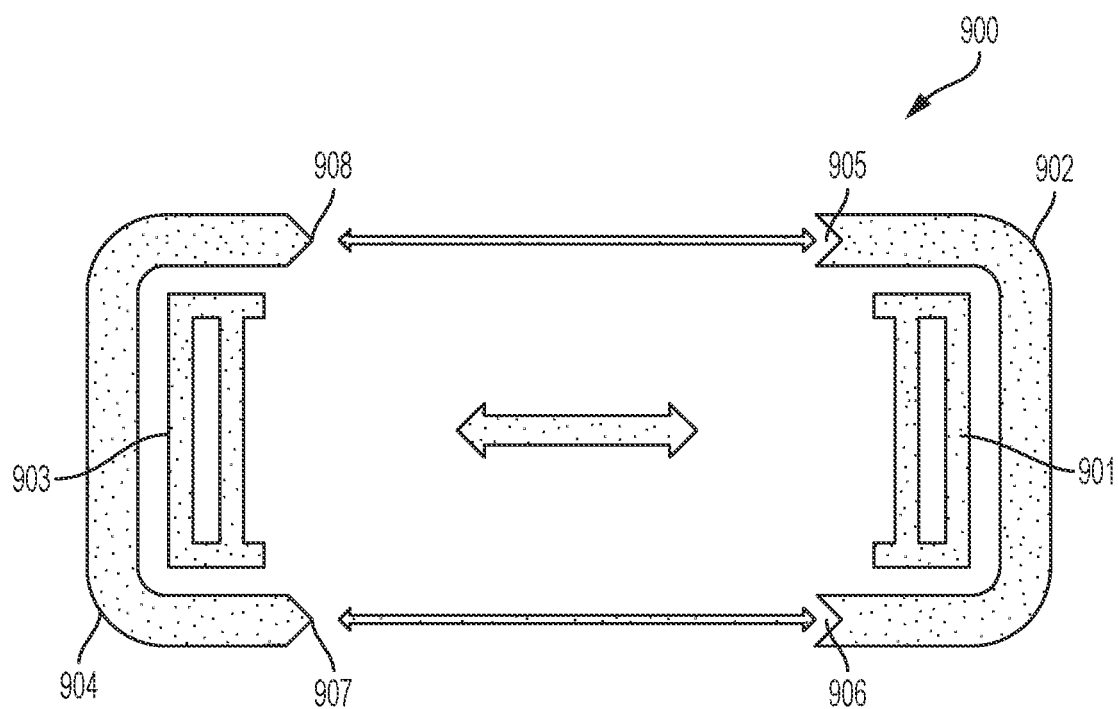
FIG. 9 shows a side view of two core-shell subassemblies and the direction of attachment in accordance with an embodiment of the invention.
Figure 10:
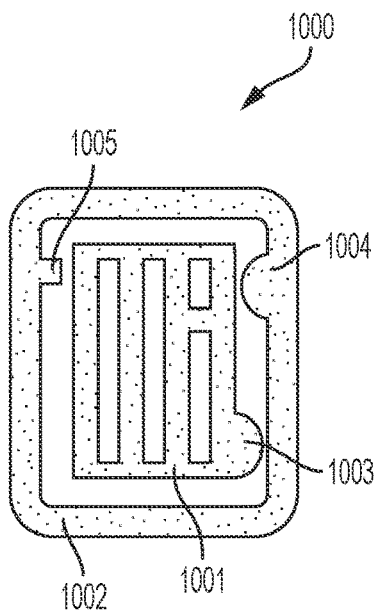
FIG. 10 shows an assembled view of the two core-shell subassemblies shown in FIG. 9.

FIG. 9 shows a schematic side view of a two piece integrated core-shell mold 900 in accordance with an aspect of the invention. The first piece includes a partial core 901 and partial shell 902, and the second piece includes a partial core 903 and partial shell 904. The partial core 901 and partial shell 902 may be formed as one integral piece, or may be separate assemblies. The partial core-shell structures are provided with attachment points 905, 906, 907, and 908 that facilitate assembly into a complete core-shell mold 1000 as shown in FIG. 10. The two-piece molds of the present invention have the advantage that they can be inspected prior to assembly and casting. Previous integral one-piece molds had the disadvantage that due to the 3-D printed nature of the mold, inspection of the mold before casting was difficult.

As shown in FIG. 10, the core-shell mold 1000 may include structures integrally formed with the core 1001 or shell 1002 portion. For example, a core bumper 1003 may be provided, or a shell bumper 1004 may be provided. Upon assembly of the two-part mold, the bumpers 1003/1004 function to provide the required spacing between the core 1001 and shell 1002. A pin support 1005 may be provided integral to the shell, which abuts the core portion upon assembly of the two-part core-shell. Although not shown, a pin structure may be provided integral to the core.

Figure 11:
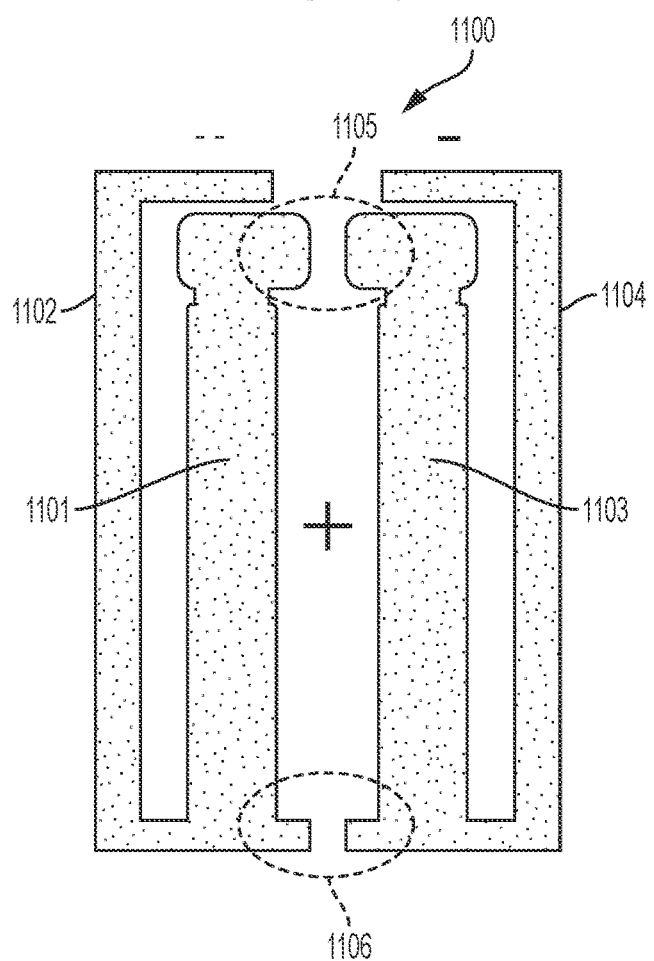
FIG. 11 shows a two part integral core-shell mold with attachment points that may be mechanically interlocked.
Figure 12:
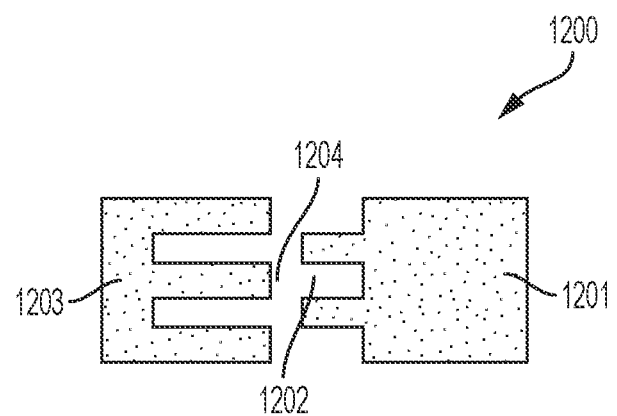
FIG. 12 shows an interlocking tongue and groove that can be used to attach two core-shell subassemblies in accordance with an embodiment of the invention.
Figure 13:
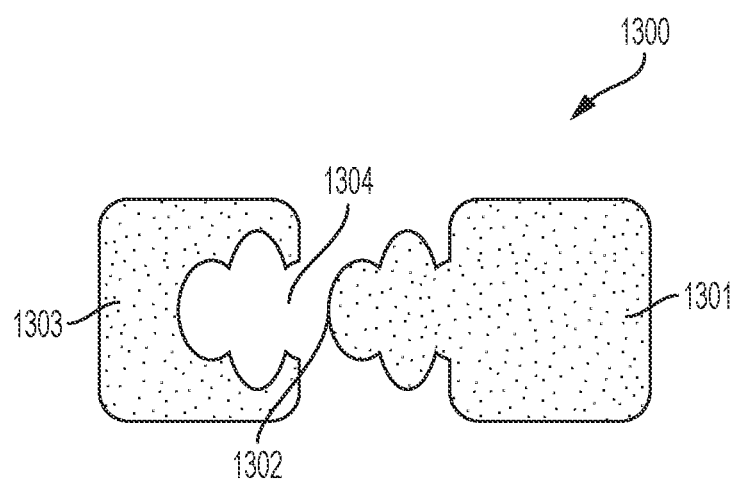
FIG. 13 shows an interlocking dovetail that can be used to attach two core-shell subassemblies in accordance with an embodiment of the invention.
Figure 14:
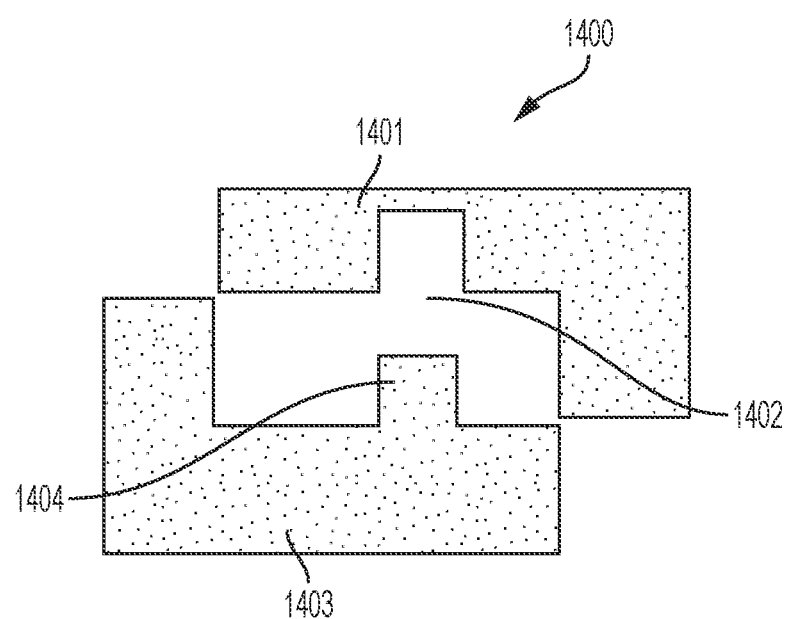
FIG. 14 shows a rabbet joint with integral interlocking peg that can be used to attach two core-shell subassemblies in accordance with an embodiment of the invention.

FIG. 11 shows a two-part core shell mold 1100 having a first core/shell portion 1101/1102 and a second core-shell portion 1103/1104. In this embodiment, a first point of attachment 1105 is provided within the tip portion of the core assembly and a second point of attachment 1106 is provided at a portion of the shell region distal the core tip region. FIGS. 12-14 illustrate several non-limiting examples of attachment mechanisms provided in the ceramic core/shell assembly. FIG. 12 illustrates an interlocking tongue and groove type attachment 1200 with a first outside portion 1201, first inside portion 1202, second outside portion 1203, and second inside portion 1204. FIG. 13 illustrates an interlocking dovetail type attachment 1300 with a first outside portion 1301, first inside portion 1302, second outside portion 1303, and second inside portion 1304. FIG.

14 illustrates a rabbet joint 1400 with interlocking peg having a first outside portion 1401, first inside portion 1402, second outside portion 1403, and second inside portion 1404.

Figure 2:
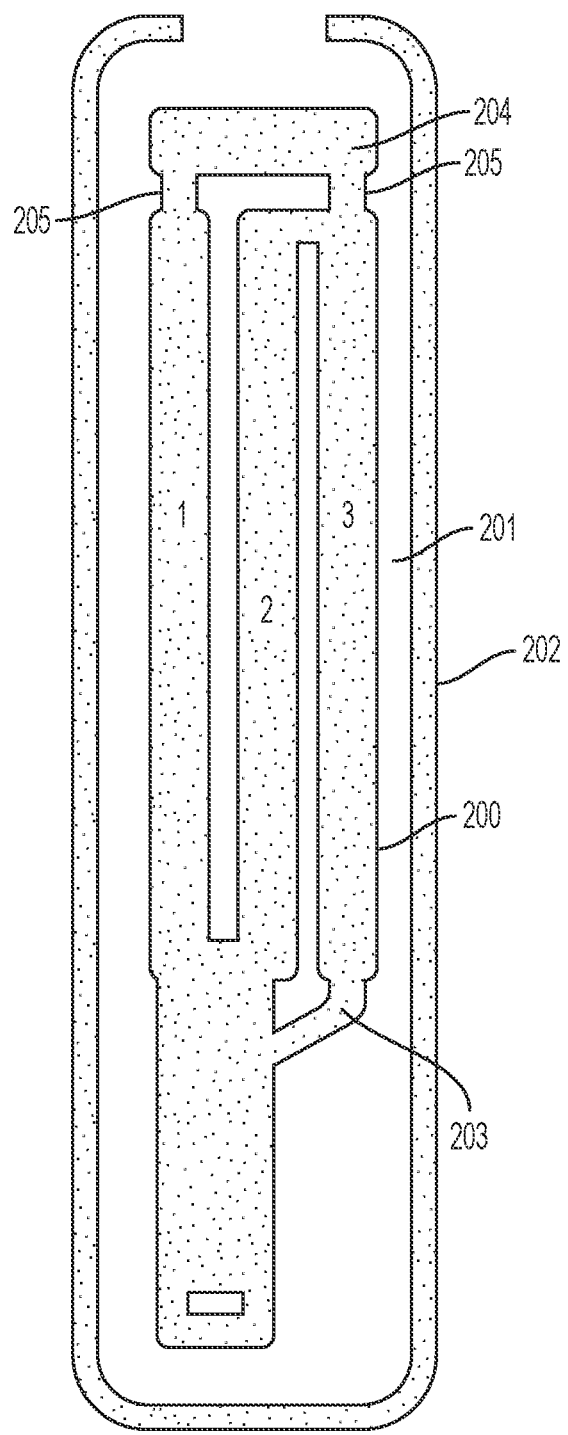
FIG. 2 is a schematic diagram showing an example of a conventional scheme for a core-shell mold with ball chute prepared by a conventional process.
Figure 3:
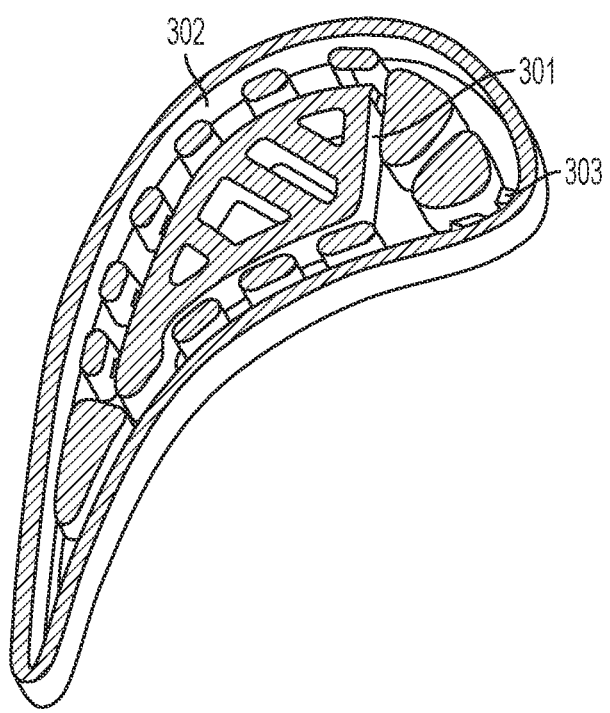
FIG. 3 shows a perspective view of a prior art integrated core-shell mold with ties connecting the core and shell portions.
Figure 4:
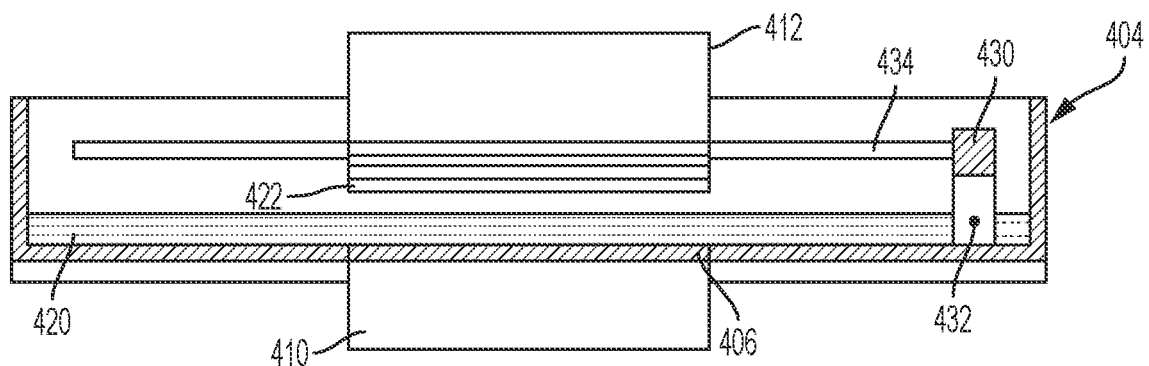
FIGS. 4, 5, 6 and 7 show schematic lateral sectional views of a device for carrying out successive phases of the method sequence for direct light processing (DLP)
Figure 5:
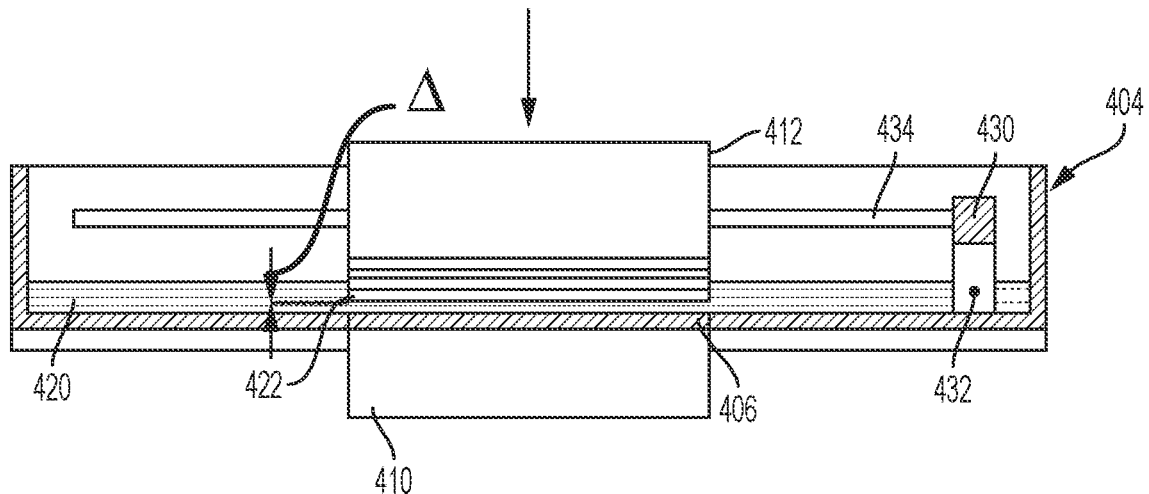
Figure 15:
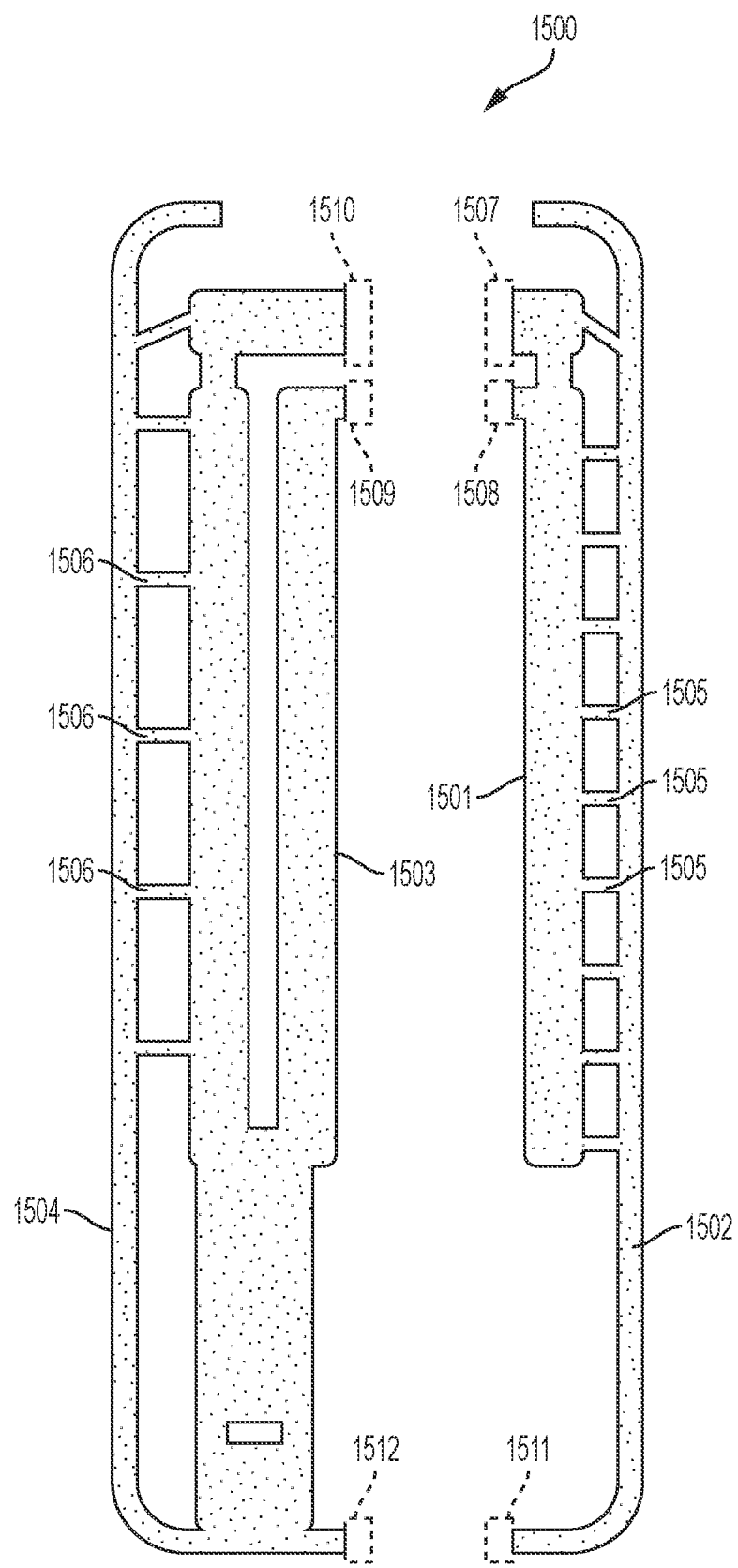
FIG. 15 shows a two-part integral core-shell mold including filaments extending from the core to the shell for purposes of providing cooling holes in the surface of a turbine blade in accordance with an embodiment of the invention.

FIG. 15 shows an example of a two-part core-shell assembly 1500 having a first core portion 1501 with attachment mechanisms 1507, 1508 and a first shell portion 1502 with attachment mechanism 1511, a second core portion 1503 with attachment mechanisms 1509, 1510 and a second shell portion 1504 with attachment mechanism 1512. The first core portion 1501 and first shell portion 1502 are linked together with filaments 1505. The second core portion 1503 and second shell portion 1504 are linked together with filaments 1506. After casting of the metal within the core-shell mold and leaching of the filaments, the filaments define a cooling hole pattern in the cast turbine blade. As described in co-pending application, GE Docket #285020, these structures are preferably formed using the DLP process described in connection with FIGS. 4-11 above. By printing the ceramic mold using the above DLP printing process, the mold can be made in a way that allows the point of connections between the core and shell to be provided through filaments 1505 and/or 1506. Once the core-shell mold is printed, it may be subject to a post-heat treatment step to cure the printed ceramic polymer material. The cured ceramic mold may then be used similar to the traditional casting process used in the production of superalloy turbine blades and stator vanes. Notably because the filaments 1505 and 1506 are provided in a large quantity consistent with formation of a pattern of effusion cooling holes in the surface of a turbine blade or stator vane, the need for a ball chute structure as shown in FIG. 2 may be eliminated.

The filaments 1505 and 1506 are preferably cylindrical or oval shape but may be curved or non-linear. Their exact dimensions may be varied according to a desired film cooling scheme for a particular cast metal part. For example cooling holes may have a cross sectional area ranging from 0.01 to 2 mm$^2$. In a turbine blade, the cross sectional area may range from 0.01 to 0.15 mm$^2$, more preferably from 0.05 to 0.1 mm$^2$, and most preferably about 0.07 mm$^2$. In the case of a vane, the cooling holes may have a cross sectional area ranging from 0.05 to 0.2 mm$^2$, more preferably 0.1 to 0.18 mm$^2$, and most preferably about 0.16 mm$^2$. The spacing of the cooling holes is typically a multiple of the diameter of the cooling holes ranging from 2× to 10× the diameter of the cooling holes, most preferably about 4-7× the diameter of the cooling holes.

The length of the filament 1505 and/or 1506 is dictated by the thickness of the cast component, e.g., turbine blade or stator vane wall thickness, and the angle at which the cooling hole is disposed relative to the surface of the cast component. The typical lengths range from 0.5 to 5 mm, more preferably between 0.7 to 1 mm, and most preferably about 0.9 mm. The angle at which a cooling hole is disposed is approximately 5 to 35° relative to the surface, more preferably between 10 to 20°, and most preferably approximately 12°. It should be appreciated that the methods of casting according to the present invention allow for formation of cooling holes having a lower angle relative to the surface of the cast component than currently available using conventional machining techniques.

Figure 16:
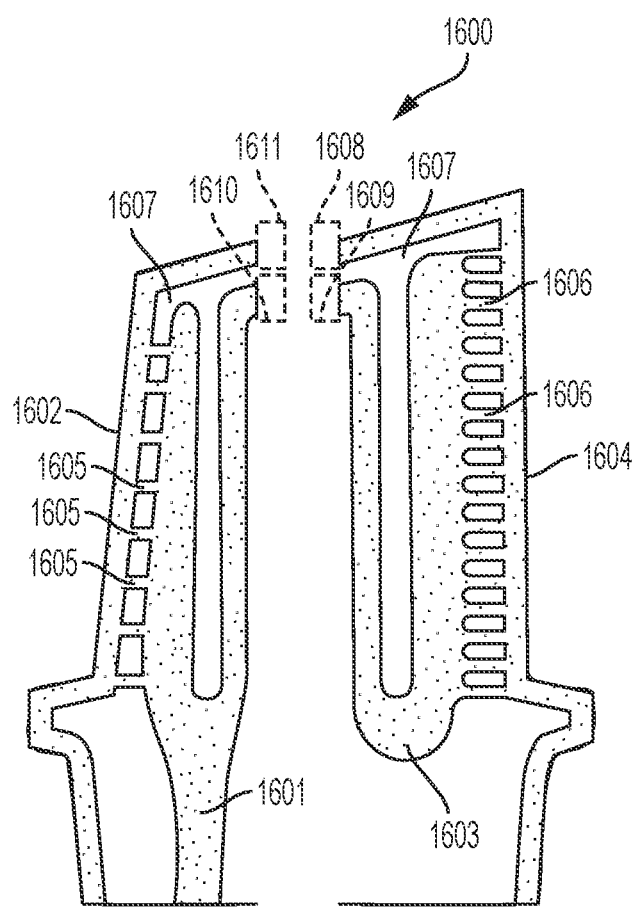
FIG. 16 shows a two-part integral core-shell mold including filaments extending from the core to the shell for purposes of providing cooling holes in the surface of a turbine blade in accordance with an embodiment of the invention.
Figure 17:
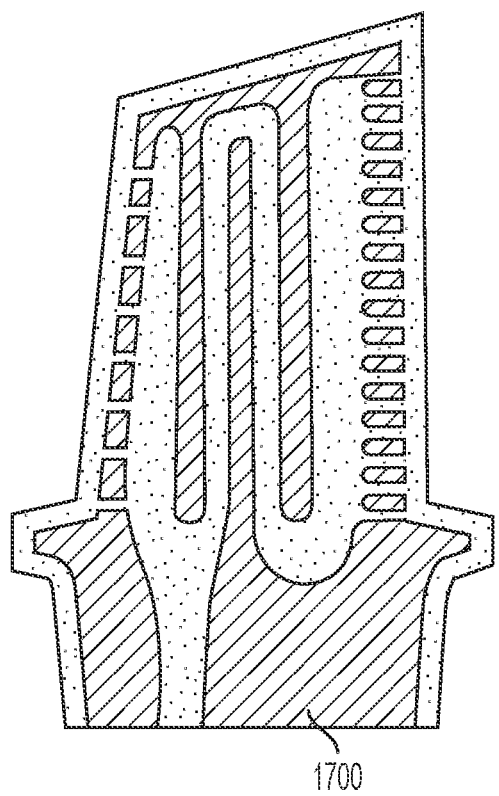
FIG. 17 is a schematic view of an integrated core shell mold having core print filaments exiting beside a blade tip in accordance with an embodiment of the invention.

FIG. 16 shows a side view of an integrated core-shell mold 1600 according to an embodiment of the present invention. As with the schematic shown in FIG. 15, the first core portion 1601 is connected to the first shell portion 1602 through several filaments 1605. Likewise, the second core portion 1603 is connected to the second shell portion 1604 through several filaments 1606. The first core portion 1601 and the first shell portion 1602 can be attached to the second core portion 1603 and the second shell portion 1604 via attachment mechanisms 1608, 1609, 1610 and 1611 to form the complete core-shell mold assembly 1600. The assembled core-shell mold 1600 defines a cavity 1607 for investment casting a turbine blade. FIG. 17 shows the cavity 1607 filled with a metal 1700, such as a nickel based alloy, i.e., INCONEL®. Upon leaching of the ceramic core-shell, the resulting cast object is a turbine blade or stator vane having a cooling hole pattern in the surface of the blade or vane. It should be appreciated that although FIGS. 16-17 provide a cross sectional view showing cooling holes at the leading and trailing edge of the turbine blade, that additional cooling holes may be provided where desired including on the sides of the turbine blades or any other location desired. In particular, the present invention may be used to form cooling holes within the casting process in any particular design. In other words, one would be able to produce conventional cooling holes in any pattern where drilling was used previously to form the cooling holes. However, the present invention will allow for cooling hole patterns previously unattainable due to the limitations of conventional technologies for creating cooling holes within cast components, i.e., drilling.

After leaching, the resulting holes in the turbine blade or stator vane from the core print filaments may be brazed shut if desired. Otherwise the holes left by the core print filaments may be incorporated into the design of the internal cooling passages. Alternatively, cooling hole filaments may be provided to connect the tip plenum core to the shell in a sufficient quantity to hold the tip plenum core in place during the metal casting step.

After printing the core-shell mold structures in accordance with the invention, the core-shell mold may be cured and/or fired depending upon the requirements of the ceramic core photopolymer material. Molten metal may be poured into the mold to form a cast object in the shape and having the features provided by the integrated core-shell mold. In the case of a turbine blade or a stator vane, the molten metal is preferably a superalloy metal that formed into a single crystal superalloy turbine blade or stator vane using techniques known to be used with conventional investment casting molds.

Figure 18:
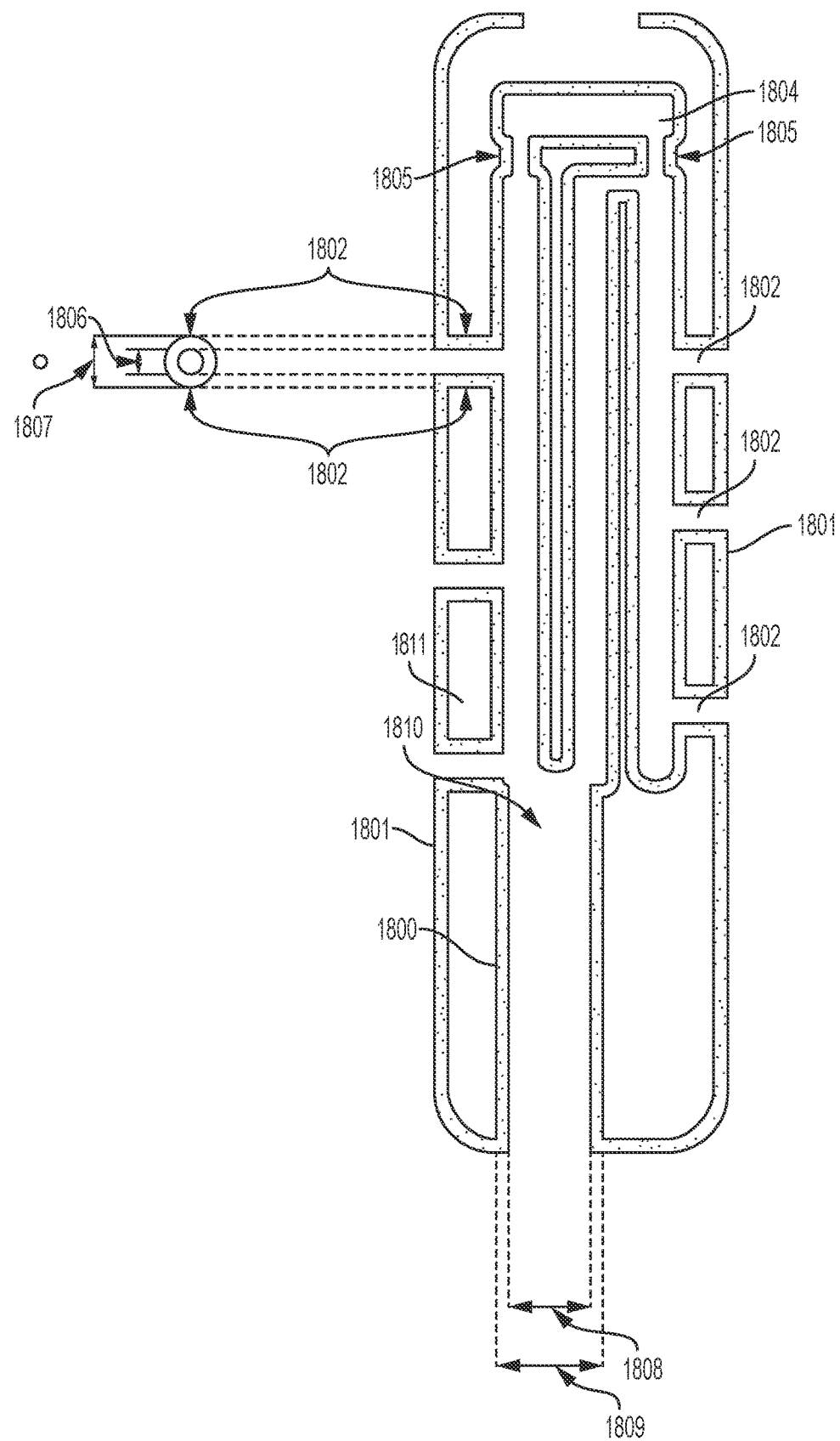
FIG. 18 shows a side view of an integrated core-shell mold with filaments connecting the core and shell portions.

FIG. 18 shows a schematic side view of an integrated core-shell mold with hollow filaments 1802 connecting the core 1800 and shell portions 1801. The hollow filaments generally have an inside diameter 1806 and an outside diameter 1807. By printing the ceramic mold using the above DLP printing process, the mold can be made in a way that allows the point of connections between the core and shell to be provided through the hollow filaments 1802. Once the core-shell mold is printed, it may be subject to a post-heat treatment step to cure the printed ceramic polymer material. The cured ceramic mold may then be used similar to the traditional casting process used in the production of superalloy turbine blades. Notably because the hollow filaments 1802 are provided in a large quantity consistent with formation of a pattern of effusion cooling holes in the surface of a turbine blade, the need for a ball chute structure as shown in FIG. 2 may be eliminated. In this embodiment, the hollow tip pins 1805 connecting the hollow tip plenum core 1804 to the hollow core 1800 are retained. After removal of the ceramic mold, tip holes exist between the hollow core 1800 and hollow tip plenum core 1804 that may be subsequently brazed shut. However, the hollow tip pins 1805 may be eliminated by connecting the tip plenum core

1804 to the shell 1801 using additional hollow filaments, avoiding the need to braze shut tip holes connecting the core cavity with the tip plenum after casting is complete.

The mold core 1800 may also be a hollow mold core in accordance with certain aspects of the invention. The hollow core has an inside diameter 1808 and an outside diameter 1809. In general, the cross sectional area defined by the inner diameter is greater than 80% of the cross sectional area of the outer diameter, preferably greater than 90%. In the case where the mold core does not have a cylindrical shape, the wall thickness of the hollow core is equivalent to that of the cylinder where the inner diameter is greater than 80% of the cross sectional area of the outer diameter.

The filaments 1802 are preferably cylindrical or oval shape but may be curved or non-linear. Their exact dimensions may be varied according to a desired film cooling scheme for a particular cast metal part. For example cooling holes may have a cross sectional area ranging from 0.01 to 2 $mm^2$. In a turbine blade or stator vane, the cross sectional area may range from 0.01 to 0.15 $mm^2$, more preferably from 0.05 to 0.1 $mm^2$, and most preferably about 0.07 $mm^2$. In the case of a vane, the cooling holes may have a cross sectional area ranging from 0.05 to 0.2 $mm^2$, more preferably 0.1 to 0.18 $mm^2$, and most preferably about 0.16 $mm^2$. The spacing of the cooling holes is typically a multiple of the diameter of the cooling holes ranging from 2× to 10× the diameter of the cooling holes, most preferably about 4-7× the diameter of the holes.

The length of the filament 1802 is dictated by the thickness of the cast component, e.g., turbine blade or stator vane wall thickness, and the angle at which the cooling hole is disposed relative to the surface of the cast component. The typical lengths range from 0.5 to 5 mm, more preferably between 0.7 to 1 mm, and most preferably about 0.9 mm. The angle at which a cooling hole is disposed is approximately 5 to 35° relative to the surface, more preferably between 10 to 20°, and most preferably approximately 12°. It should be appreciated that the methods of casting according to the present invention allow for formation of cooling holes having a lower angle relative to the surface of the cast component than currently available using conventional machining techniques.

The cross-sectional area defined by the inner diameter 1806 of the hollow filament should be at least 50% of the outer diameter 1807 of the filament. For thinner tubes this cross-sectional area can be increased, for example, to 60%, 70%, or 75% of the outer diameter of the filament. In some cases one or more of the filaments connecting the core 1800 and the shell 1801 of the turbine blade may be solid.

Figure 19:
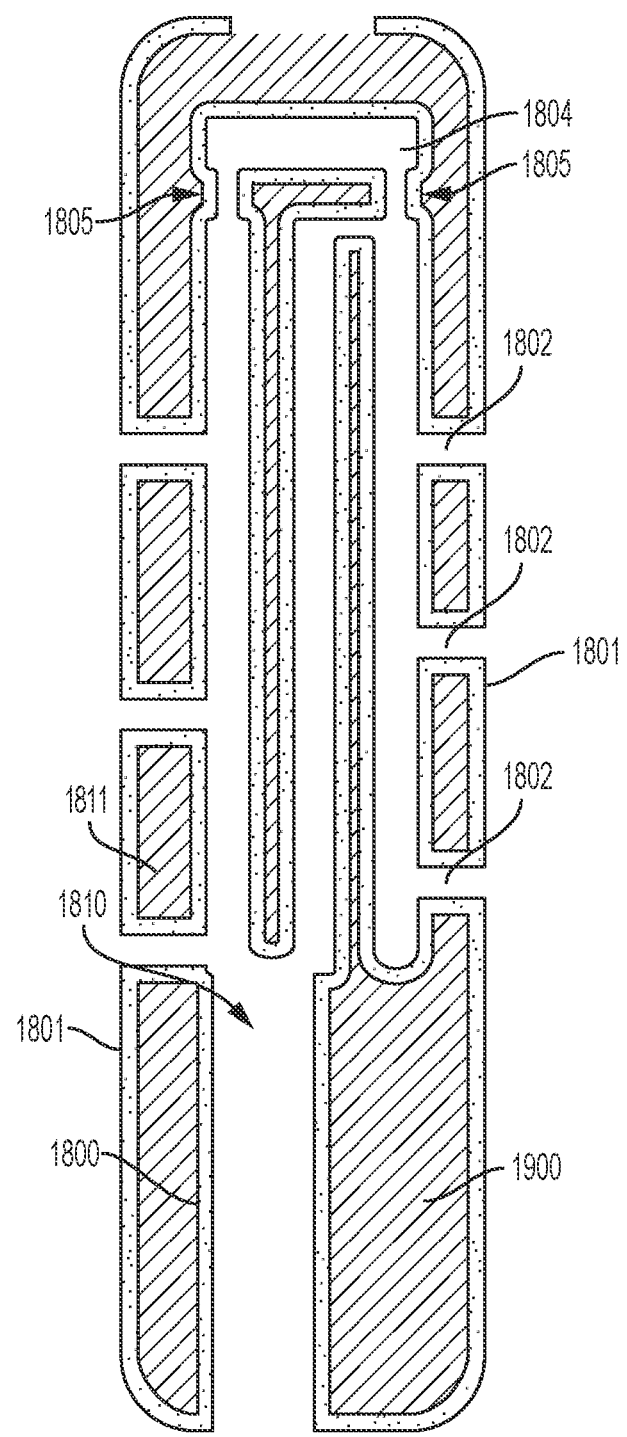
FIG. 19 show the integrated core-shell mold of FIG. 18 filled with cast metal.

FIG. 19 shows the integrated core-shell mold of FIG. 18 filled with cast metal 1900, such as a nickel based alloy, i.e., INCONEL®. The metal is filled into cavity 1811, while the hollow core cavity 1810 is left unfilled. After casting, the ceramic core 1800, shell 1801 and filaments 1802 are removed using a combination of chemical and mechanical processes. The hollow nature of the core 1800 and filaments 1802 allows for removal of the ceramic mold while minimizing the amount of chemical leaching needed. This saves time and reduces the potential for errors in the manufacturing process.

Upon leaching of the ceramic core-shell, the resulting cast object is a turbine blade having a cooling hole pattern in the surface of the blade. It should be appreciated that although FIGS. 18-19 provide a cross sectional view showing cooling holes at the leading and trailing edge of the turbine blade, that additional cooling holes may be provided where desired including on the sides of the turbine blades or any other location desired. In particular, the present invention may be used to form cooling holes within the casting process in any particular design. In other words, one would be able to produce conventional cooling holes in any pattern where drilling was used previously to form the cooling holes. However, the present invention will allow for cooling hole patterns previously unattainable due to the limitations of conventional technologies for creating cooling holes within cast components, i.e., drilling.

Figure 20:
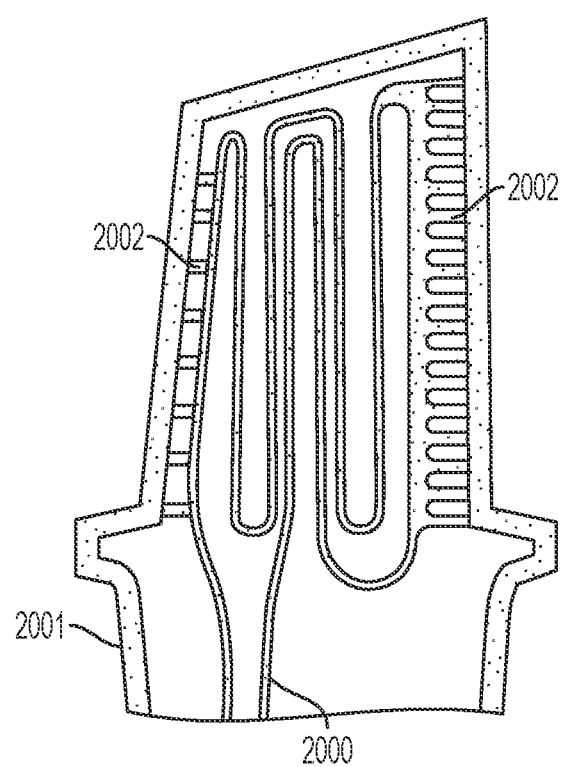
FIG. 20 shows a side view of an integrated core-shell mold according to an embodiment of the present invention.
Figure 21:
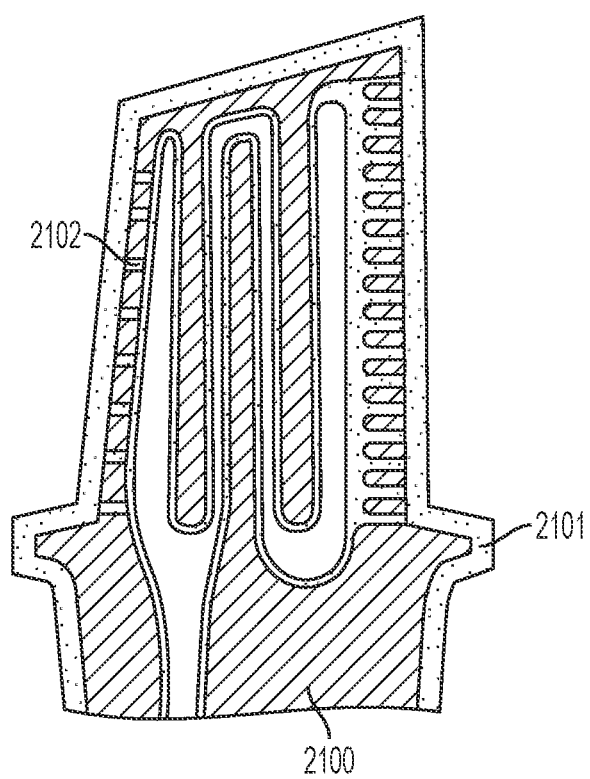
FIG. 21 shows a side view of a superalloy-filled integrated core-shell mold according to an embodiment of the present invention.

FIG. 20 shows a side view of an integrated core-shell mold according to an embodiment of the present invention. In this embodiment, the mold has a hollow ceramic core 2000 and a ceramic shell 2001 or 2101 as shown in FIG. 21. The core 2000 and shell 2001 are connected by filaments 2002. The filaments 2002 are shown as solid filaments that end up resulting in holes in the ultimate cast object. The filaments 2002 may be made hollow as described above. Because of the relatively small size of the filaments 2002 relative to the core 2000, the filaments may be made solid and the core hollow as shown in FIG. 19. The hollow core provides a cavity 1810 that can subsequently be filled with metal. Because the wall thickness of the hollow core is controlled (as opposed to a solid core), subsequent leaching of the ceramic core can be expedited. As noted above, the filaments 2002, 2102 may be solid filaments as shown in FIGS. 20 and 21, or hollow filaments as shown in FIGS. 18-19.

After leaching, the resulting holes in the turbine blade from the core print filaments may be brazed shut if desired. Otherwise the holes left by the core print filaments may be incorporated into the design of the internal cooling passages. Alternatively, cooling hole filaments may be provided to connect the tip plenum core to the shell in a sufficient quantity to hold the tip plenum core in place during the metal casting step.

Figure 22:
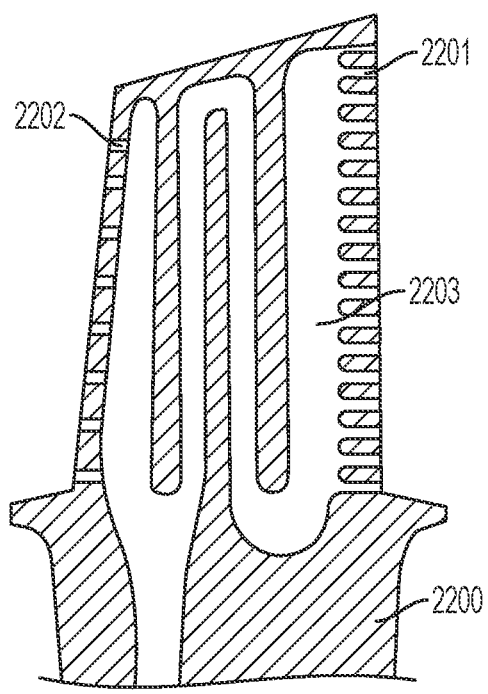
FIG. 22 shows the cast turbine blade made in accordance with the invention.

After printing the core-shell mold structures in accordance with the invention, the core-shell mold may be cured and/or fired depending upon the requirements of the ceramic core photopolymer material. Molten metal may be poured into the mold to form a cast object in the shape and having the features provided by the integrated core-shell mold. In the case of a turbine blade or stator vane, the molten metal is preferably a superalloy metal that is formed into a single crystal superalloy turbine blade or stator vane using techniques known to be used with conventional investment casting molds. FIG. 21 shows the ceramic integrated mold 2000/2001 of FIG. 20 filled with cast metal 2100, such as a nickel based alloy, i.e., INCONEL®. After metal is filled into the mold, the ceramic mold is removed using a combination of mechanical and chemical processes (i.e., leaching). After leaching, the resulting holes in the turbine blade serve as effusion cooling holes. FIG. 22 shows a cast turbine blade 2200 with cooling holes 2201, 2202 connecting the blade surface to the hollow core 2203 of the blade.

Figure 23:
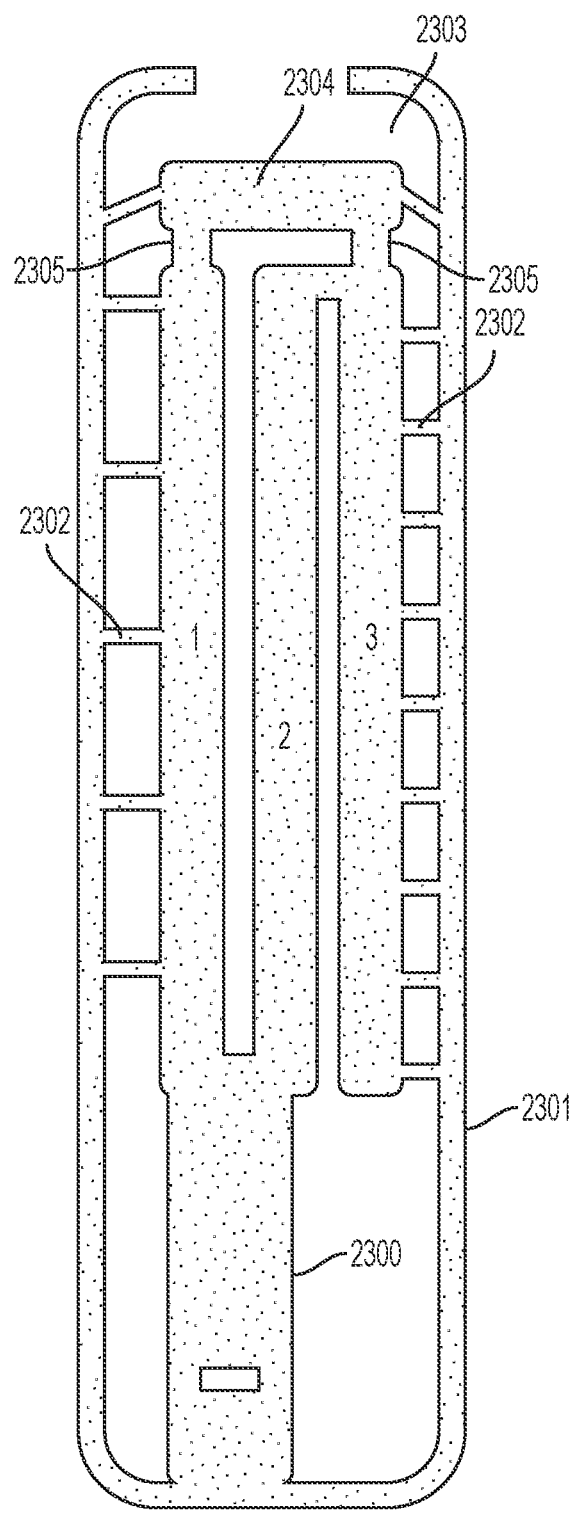
FIG. 23 shows a side view of an integrated core-shell mold with filaments connecting the core and shell portions.

FIG. 23 shows a schematic side view of an integrated core-shell mold with filaments 2302 connecting the core 2300 and shell portions 2301. By printing the ceramic mold using the above DLP printing process, the mold can be made in a way that allows the point of connections between the core and shell to be provided through filaments 2302. Once the core-shell mold is printed, it may be subject to a post-heat treatment step to cure the printed ceramic polymer material. The cured ceramic mold may then be used similar to the traditional casting process used in the production of superalloy turbine blades or vanes. Notably because the filaments 2302 are provided in a large quantity consistent with formation of a pattern of effusion cooling holes in the surface of a turbine blade or vane, the need for a ball chute structure as shown in FIG. 2 may be eliminated. In this embodiment, the tip pins 2305 connecting the tip plenum core 2304 to the core 2300 are retained, and a void 2303 exists between the shell portion 2301 and the tip plenum core 2304. After removal of the ceramic mold, tip holes exist between the core 2300 and tip plenum core 2304 that may be subsequently brazed shut. However, the tip pins 2305 may be eliminated, avoiding the need to braze shut tip holes connecting the core cavity with the tip plenum.

The filaments 2302 are preferably cylindrical or oval shape but may also be curved or non-linear. Their exact dimensions may be varied according to a desired film cooling scheme for a particular cast metal part. For example cooling holes may have a cross sectional area ranging from 0.01 to 2 $mm^2$. In a turbine blade, the cross sectional area may range from 0.01 to 0.15 $mm^2$, more preferably from 0.05 to 0.1 $mm^2$, and most preferably about 0.07 $mm^2$. In the case of a vane, the cooling holes may have a cross sectional area ranging from 0.05 to 0.2 $mm^2$, more preferably 0.1 to 0.18 $mm^2$, and most preferably about 0.16 $mm^2$. The spacing of the cooling holes is typically a multiple of the diameter of the cooling holes ranging from 2× to 10× the diameter of the cooling holes, most preferably about 4-7× the diameter of the holes.

The length of the filament 2302 is dictated by the thickness of the cast component, e.g., turbine blade or stator vane wall thickness, and the angle at which the cooling hole is disposed relative to the surface of the cast component. The typical lengths range from 0.5 to 5 mm, more preferably between 0.7 to 1 mm, and most preferably about 0.9 mm. The angle at which a cooling hole is disposed is approximately 5 to 35° relative to the surface, more preferably between 10 to 20°, and most preferably approximately 12°. It should be appreciated that the methods of casting according to the present invention allow for formation of cooling holes having a lower angle relative to the surface of the cast component than currently available using conventional machining techniques.

Figure 24:
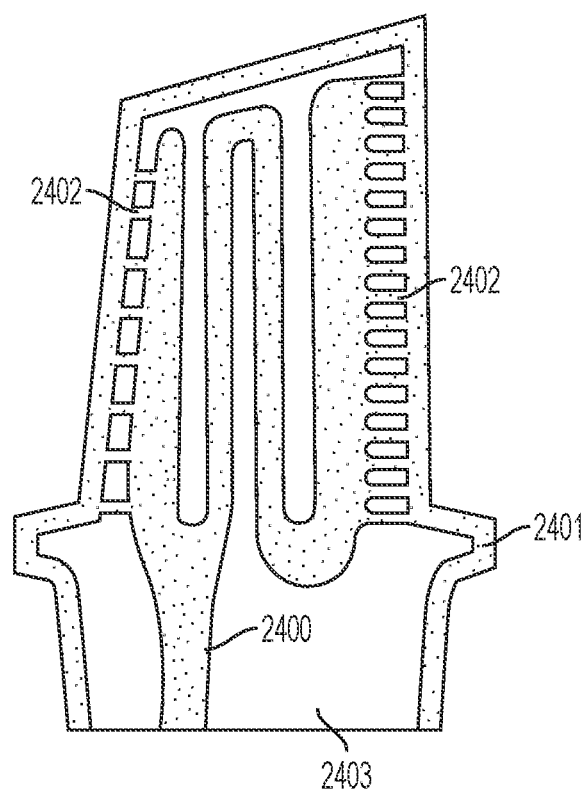
FIG. 24 shows a side view of an integrated core-shell mold according to an embodiment of the present invention.
Figure 25:
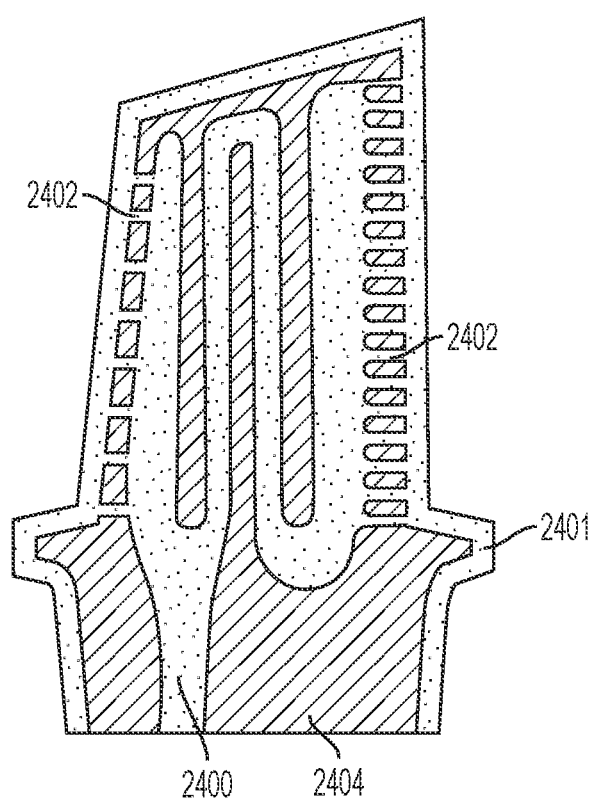
FIG. 25 shows a side view of a superalloy-filled integrated core-shell mold according to an embodiment of the present invention.

FIG. 24 shows a side view of an integrated core-shell mold according to an embodiment of the present invention. As with the schematic shown in FIG. 23, the core 2400 is connected to the shell 2401 through several filaments 2402. The core-shell mold 2400/2401 defines a cavity 2403 for investment casting a turbine blade. FIG. 25 shows the cavity 2403 filled with a metal 2404, such as a nickel based alloy, i.e., INCONEL®. Upon leaching of the ceramic core-shell, the resulting cast object is a turbine blade having a cooling hole pattern in the surface of the blade. It should be appreciated that although FIGS. 24-25 provide a cross sectional view showing cooling holes at the leading and trailing edge of the turbine blade, that additional cooling holes may be provided where desired including on the sides of the turbine blades or any other location desired. In particular, the present invention may be used to form cooling holes within the casting process in any particular design. In other words, one would be able to produce conventional cooling holes in any pattern where drilling was used previously to form the cooling holes. However, the present invention will allow for cooling hole patterns previously unattainable due to the limitations of conventional technologies for creating cooling holes within cast components, i.e., drilling.

Figure 26:
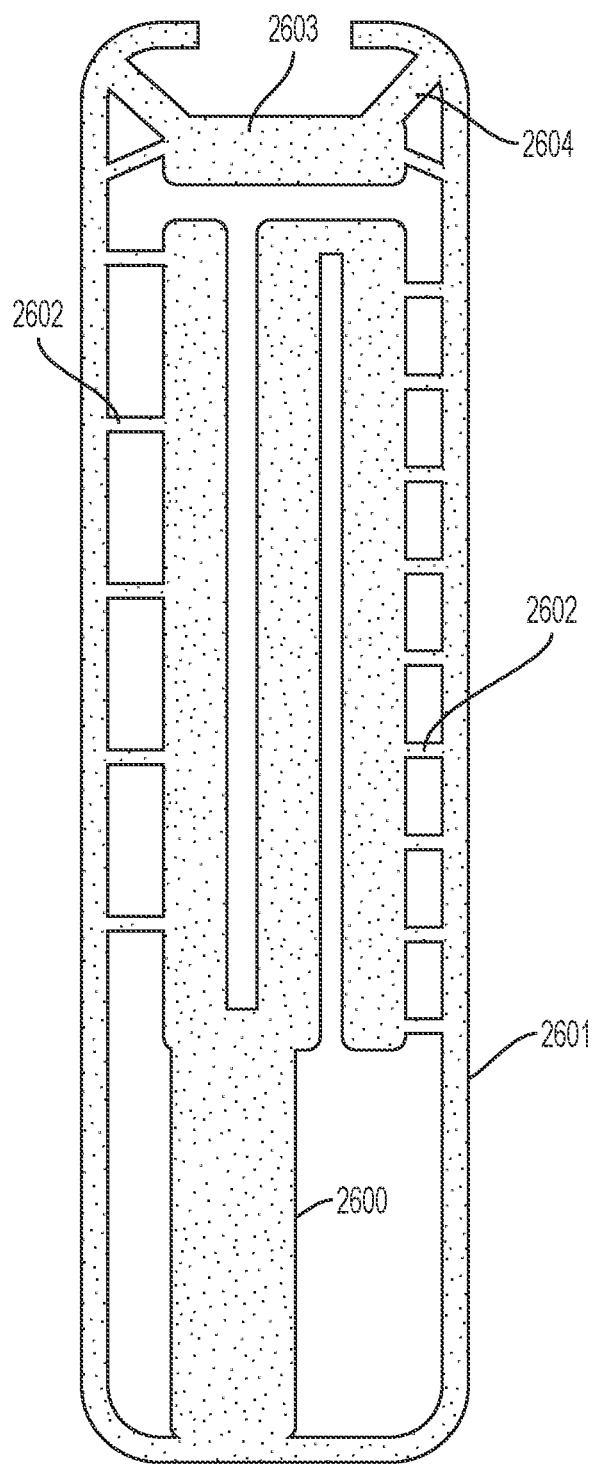
FIG. 26 is a schematic view of an integrated core shell mold having core print filaments exiting above a blade tip in accordance with an embodiment of the invention.

FIG. 26 is a schematic view of an integrated core-shell mold having a floating tip plenum core 2603. As with the schematic shown in FIG. 23, the core 2600 is connected to the shell 2601 through several filaments 2602. The tip plenum core 2603 is held in place relative to the shell with core print filaments 2604, eliminating the need for tip pins as shown in FIG. 23 or a shell lock to attach the tip plenum core to the shell as used in conventional investment casting. In this embodiment, the core print filaments 2604 exit at or near the top of the tip plenum core 2603. The core print filaments 2604 provide additional support holding tip plenum core 2603 in place, and have a cross sectional area that is sufficiently large to support the weight of the tip plenum core during the casting process. For example the cross sectional area of a core print filament is generally larger than the cross sectional area of the cooling hole filaments. In one case, the cross sectional area of the core print filament is greater than 2 $mm^2$, and may have an area on the order of a square centimeter.

The core print filaments 2604 may be necessary if there are no cooling hole filaments between the tip plenum core and the shell, or if the amount or size of the filaments are insufficient to hold the tip plenum core in place during the metal casting step. The provision of core print filaments 2604 allow the tip plenum core 2603 to float above and be disconnected from the main core. This eliminates the need for tip pins that result in tip holes connecting the surface of the turbine blade exposed through the tip plenum to the main core cavity of the turbine blade. The elimination of the tip holes is advantageous since it eliminates the post-casting step of brazing tip holes shut. This design provides a novel core-shell structure and eliminates conventional structures such as tip pins and/or a shell lock to hole the tip core relative to the shell.

Figure 27:
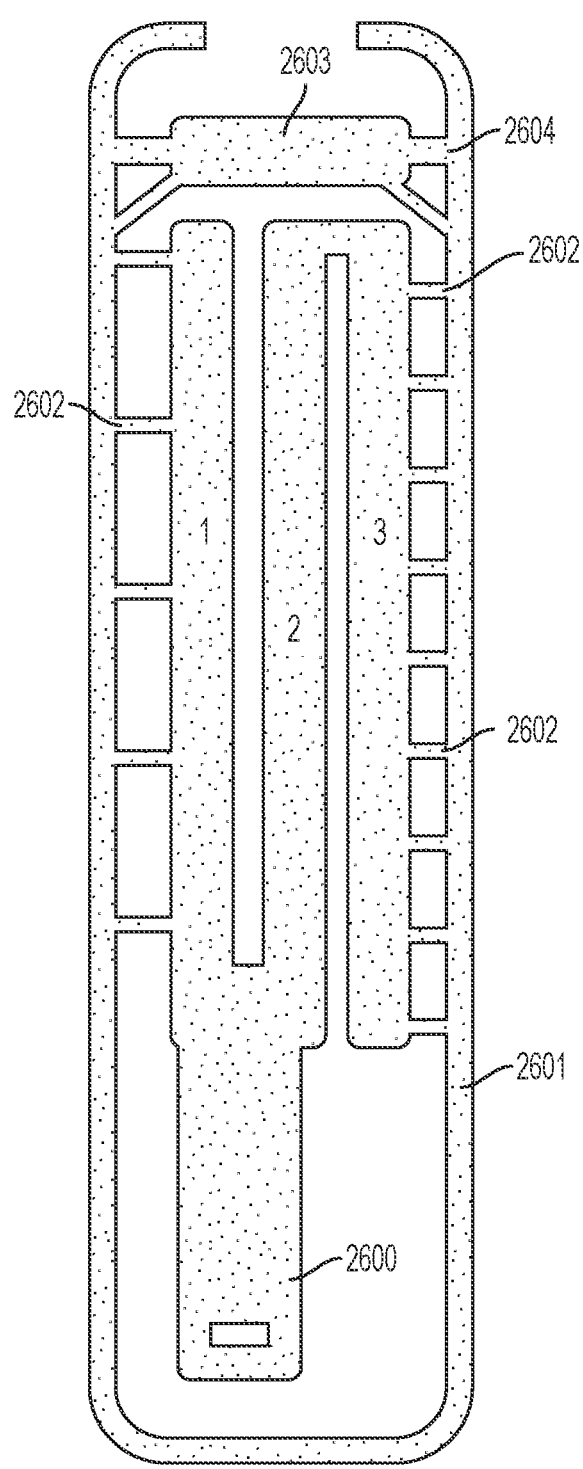
FIG. 27 is a schematic view of an integrated core shell mold having core print filaments exiting beside a blade tip in accordance with an embodiment of the invention.

After leaching, the resulting holes in the turbine blade from the core print filaments may be brazed shut if desired. Otherwise the holes left by the core print filaments may be incorporated into the design of the internal cooling passages. Alternatively, cooling hole filaments may be provided to connect the tip plenum core to the shell in a sufficient quantity to hold the tip plenum core in place during the metal casting step. FIG. 27 provides an alternative design where core filaments exit to the side of the blade tip plenum 2603.

After printing the core-shell mold structures in accordance with the invention, the core-shell mold may be cured and/or fired depending upon the requirements of the ceramic core photopolymer material. Molten metal may be poured into the mold to form a cast object in the shape and having the features provided by the integrated core-shell mold. In the case of a turbine blade or stator vane, the molten metal is preferably a superalloy metal that formed into a single crystal superalloy turbine blade or stator vane using techniques known to be used with conventional investment casting molds.

Figure 28A:
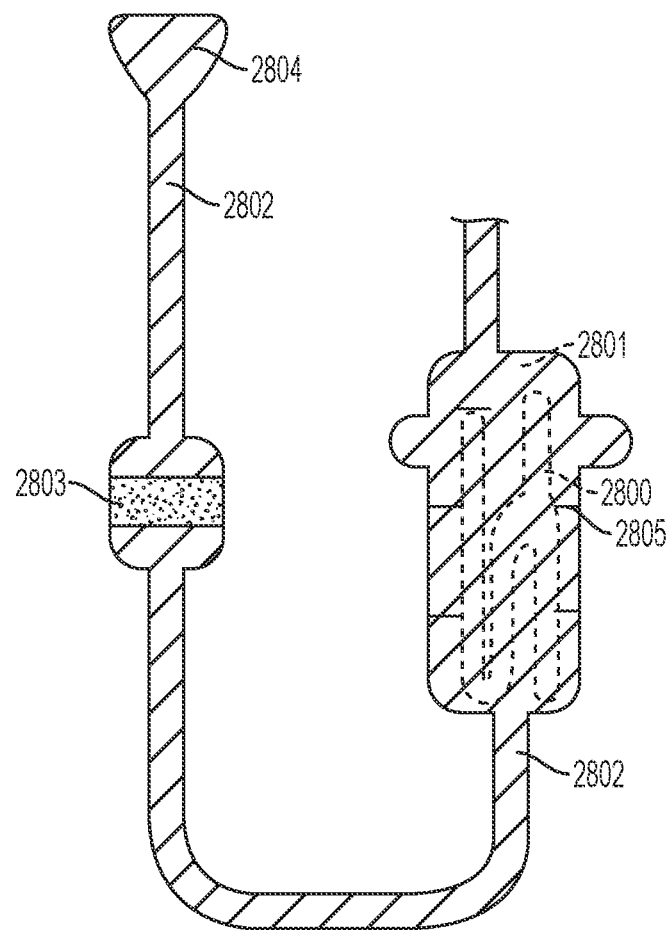
FIG. 28A is a schematic diagram showing a conventional ceramic mold attached to a wax tree structure for investment casting of a turbine blade.
Figure 28B:
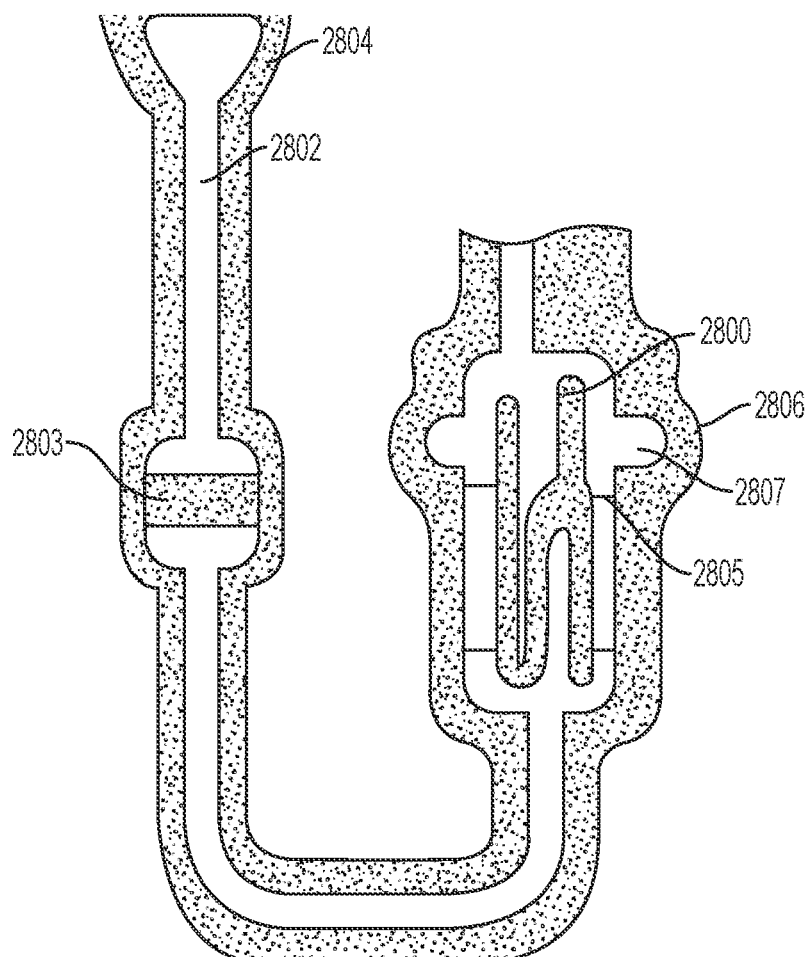
FIG. 28B is a schematic diagram showing the conventional ceramic mold of FIG. 28A after the wax has been removed.
Figure 28C:
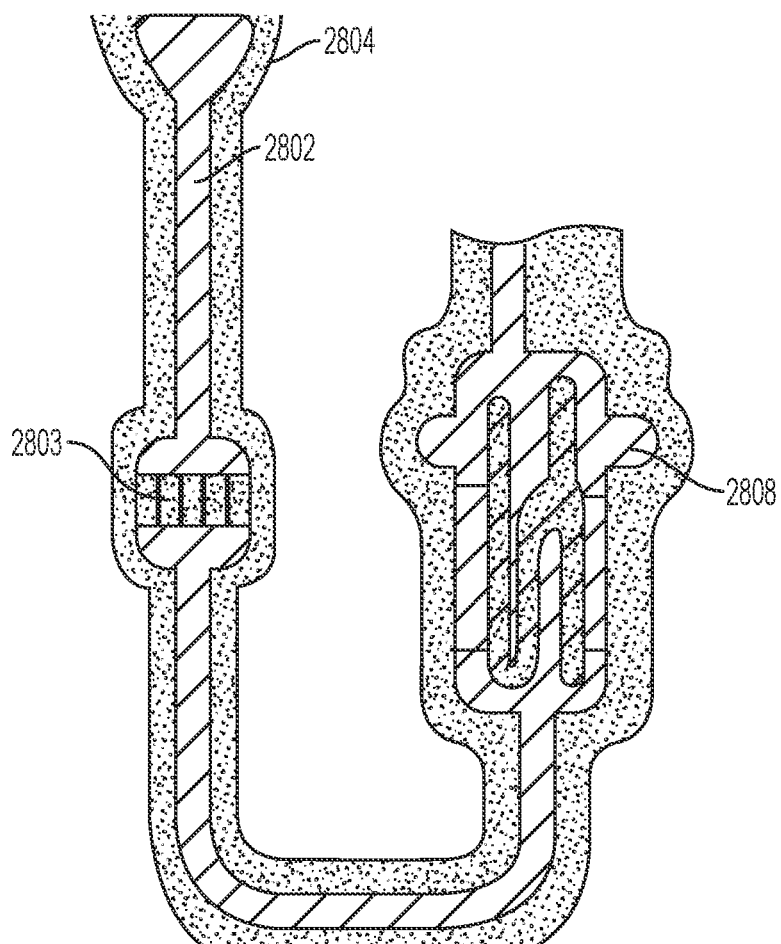
FIG. 28C is a schematic diagram showing the conventional ceramic mold of FIG. 28A after molten metal is poured into the mold.

A schematic view of such a mold structure as a variation of FIG. 2 is shown in FIGS. 28A-28C. The ceramic core 2800 is assembled inside two die halves which form a space or void therebetween that defines the resulting metal portions of the turbine blade. Wax is injected into the assembled dies to fill the void and surround the ceramic core encapsulated therein. The two die halves are split apart and removed from the molded wax. The molded wax has the precise configuration of the desired turbine blade. The molded wax blade 2801 with encapsulated ceramic core 2800 is then attached to a wax tree structure 2802 that will ultimately define a flowpath for molten metal into the ceramic mold. The wax blade includes pins 2805 for holding the core in place. The tree structure 2802 may include a funnel shaped portion 2804 for adding molten metal to the mold. As shown in FIG. 28A, the tree structure 2802 includes a ceramic filter 2803 for filtration of molten metal in the casting operation.

Figure 28D:
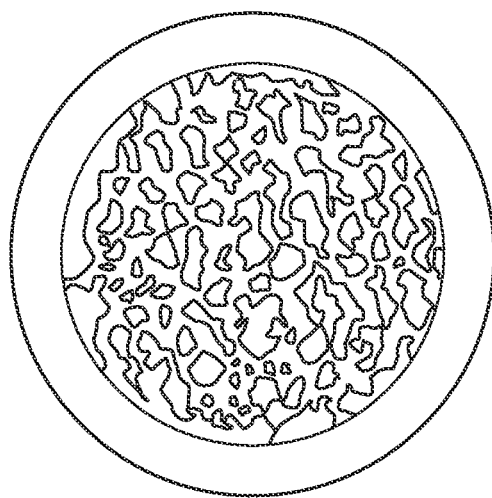
FIG. 28D is a conventional ceramic foam filter.
Figure 28E:
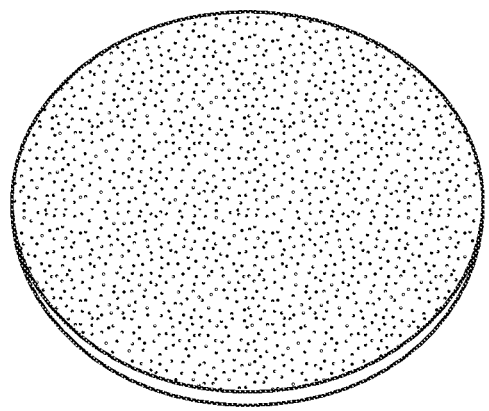
FIG. 28E is a conventional ceramic flat primary filter.

The ceramic filters known in the art include ceramic foam filters (CFF) as shown in FIG. 28D. These filters are formed by impregnating reticulated polyurethane foam with ceramic slip, removing the excess slip by squeezing the foam, and then drying and firing the body forming a CFF. Other known ceramic filters include symmetric filters such as the standard flat primary filter shown in FIG. 28E. More recently, ceramic filters have been made using various additive technologies. For example, U.S. Patent Application Pub. No. 2016/0038866 A1 entitled "ceramic filters" describes an additively manufactured ceramic filter. Another example is "Advanced Filtration to Improve Single Crystal Casting Yield—Mikro Systems," available at the National Energy Technology Laboratory (NETL) website. These filters are sold as stand-alone filters that may be incorporated in the wax tree as shown in FIG. 28A, and then incorporated into the ceramic mold as shown in FIG. 28B.

After wax injection, the entire wax tree structure 2802, ceramic filter 2803, and wax turbine blade 2801 is then coated with a ceramic material to form a ceramic shell 2806 as shown in FIG. 28B. Then, the wax is melted and removed from the shell 2806 leaving a corresponding void or space 2807 between the ceramic shell 2806 and the internal ceramic core 2800. The ceramic core is held in place after the wax is removed by pins 2805. As shown in FIG. 28C, molten superalloy metal 2808 is then poured into the shell to fill the void 2807 therein and again encapsulate the ceramic core 2800 contained in the shell 2806. The molten metal is cooled and solidifies, and then the external shell 2806 and internal core 2800 are suitably removed leaving behind the desired metallic turbine blade.

Figure 29:
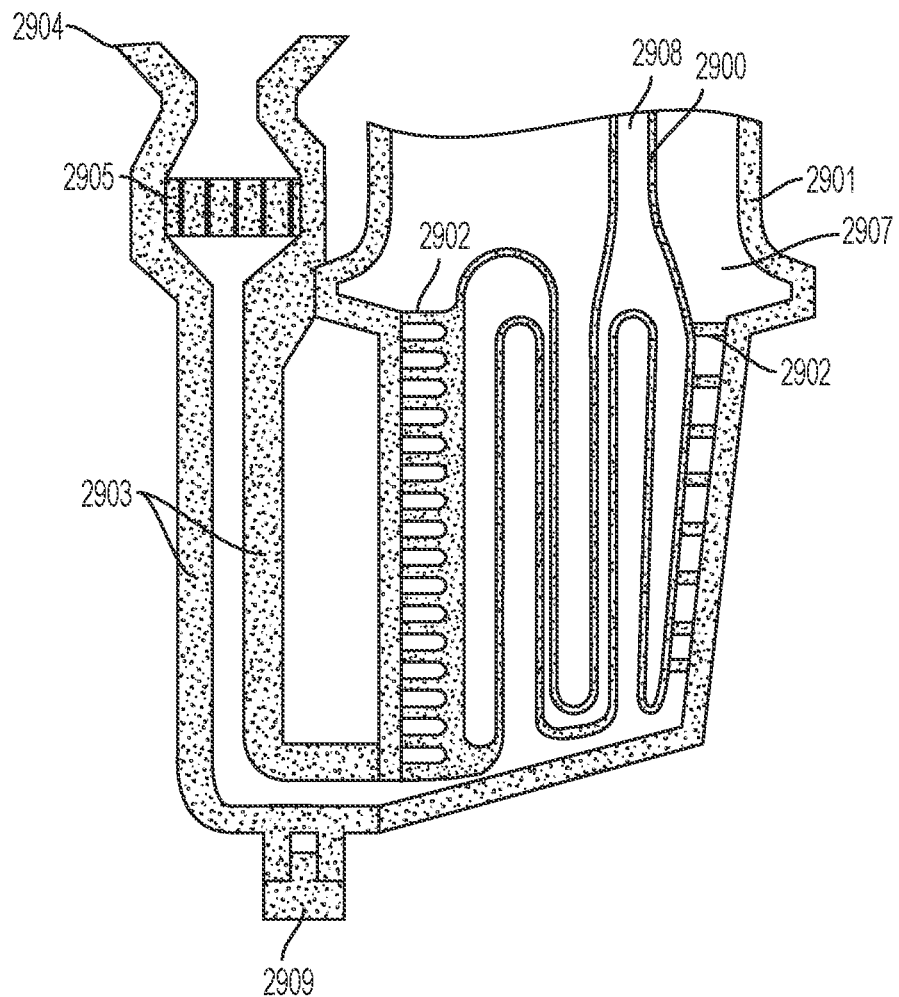
FIG. 29 shows a side view of a core-shell mold including an integrated ceramic filter.

FIG. 29 shows a schematic side view of an integrated core-shell mold with filaments 2902 connecting the core 2900 and shell portions 2901 of the integrated mold. By printing the ceramic mold using the above DLP printing process, the mold can be made in a way that allows the point of connections between the core and shell to be provided through filaments 2902. Once the core-shell mold is printed, it may be subject to a post-heat treatment step to cure the printed ceramic polymer material. The cured ceramic mold may then be used similar to the traditional casting process used in the production of superalloy turbine blades and stator vanes.

The mold also includes a tube 2903 and a funnel section 2904 for flowing liquid metal into the integrated mold. An integrated filter 2905 is provided within the flow-path for liquid metal as shown in FIG. 29.

A port 2909 is provided for cleaning the integrated core-shell mold before heat treatment and/or metal addition. After printing the ceramic mold by DLP there may be uncured resin within the mold portion or filter portion. The port 2909 is provided to allow a flowpath for solvent used to remove uncured resin. In the embodiment shown in FIG. 29, the port 2909 is placed underneath the tube 2903. If desired, several cleaning ports may be provided in the tube portion or core-shell mold portion. The port 2909 may include a screw cap which can be directly printed in the DLP process. However, any method of closing the port may be used. For example, in one aspect the cleaning port is merely a hole in the tube or mold portion that can subsequently be patched with ceramic material prior to curing the mold after the solvent cleaning step is performed.

In accordance with one aspect of the invention, filaments are not used to form a cooling hole pattern. Instead, two or more filaments are provided simply to hold the ceramic core 2900 in place while metal is poured into the mold.

The filaments 2902 are preferably cylindrical or oval shape, but may be curved or non-linear. Their exact dimensions may be varied according to a desired film cooling scheme for a particular cast metal part. For example cooling holes may have a cross sectional area ranging from 0.01 to 2 $mm^2$. In a turbine blade, the cross sectional area may range from 0.01 to 0.15 $mm^2$, more preferably from 0.05 to 0.1 $mm^2$, and most preferably about 0.07 $mm^2$. In the case of a vane, the cooling holes may have a cross sectional area ranging from 0.05 to 0.2 $mm^2$, more preferably 0.1 to 0.18 $mm^2$, and most preferably about 0.16 $mm^2$. The spacing of the cooling holes is typically a multiple of the diameter of the cooling holes ranging from 2× to 10× the diameter of the cooling holes, most preferably about 4-7× the diameter of the holes.

The length of the filament 2902 is dictated by the thickness of the cast component, e.g., turbine blade or stator vane wall thickness, and the angle at which the cooling hole is disposed relative to the surface of the cast component. The typical lengths range from 0.5 to 5 mm, more preferably between 0.7 to 1 mm, and most preferably about 0.9 mm. The angle at which a cooling hole is disposed is approximately 5 to 35° relative to the surface, more preferably between 10 to 20°, and most preferably approximately 12°. It should be appreciated that the methods of casting according to the present invention allow for formation of cooling holes having a lower angle relative to the surface of the cast component than currently available using conventional machining techniques.

Notably, the core shown in FIG. 29 is a hollow core construction. One advantage of printing a hollow core is that it reduces the extent of leaching necessary to remove the core after metal casting. In one aspect the core is completely solid ceramic material that can subsequently be leached out. In another aspect of the invention, both the core and connecting filaments are hollow allowing rapid leaching of the ceramic mold material after casting.

The ceramic filter is adapted for filtration of molten metal as it is poured into the mold.

The DLP process described above is particularly suited to provide resolution sufficient to provide porosity for a ceramic filter for filtering molten metal. The particular geometry of the filter used with respect to the invention will depend upon the characteristics of the metal to be used and the design requirements of the finished product. The geometry of the conventional ceramic filters shown in FIGS. 28D and 28E may be used. Preferably, the filter has a cylindrical shape where the height of the cylinder is less than the diameter of the filter. The ceramic filter preferably includes an inlet surface and outlet surface and openings providing a pathway for liquid metal to pass from the inlet surface through the filter and then the outlet surface. The openings preferably comprise at least 60% to at least about 90% of a total volume of the ceramic filter. More preferably, the openings comprise at least 70% to at least about 85% of a total volume of the ceramic filter.

Figure 30:
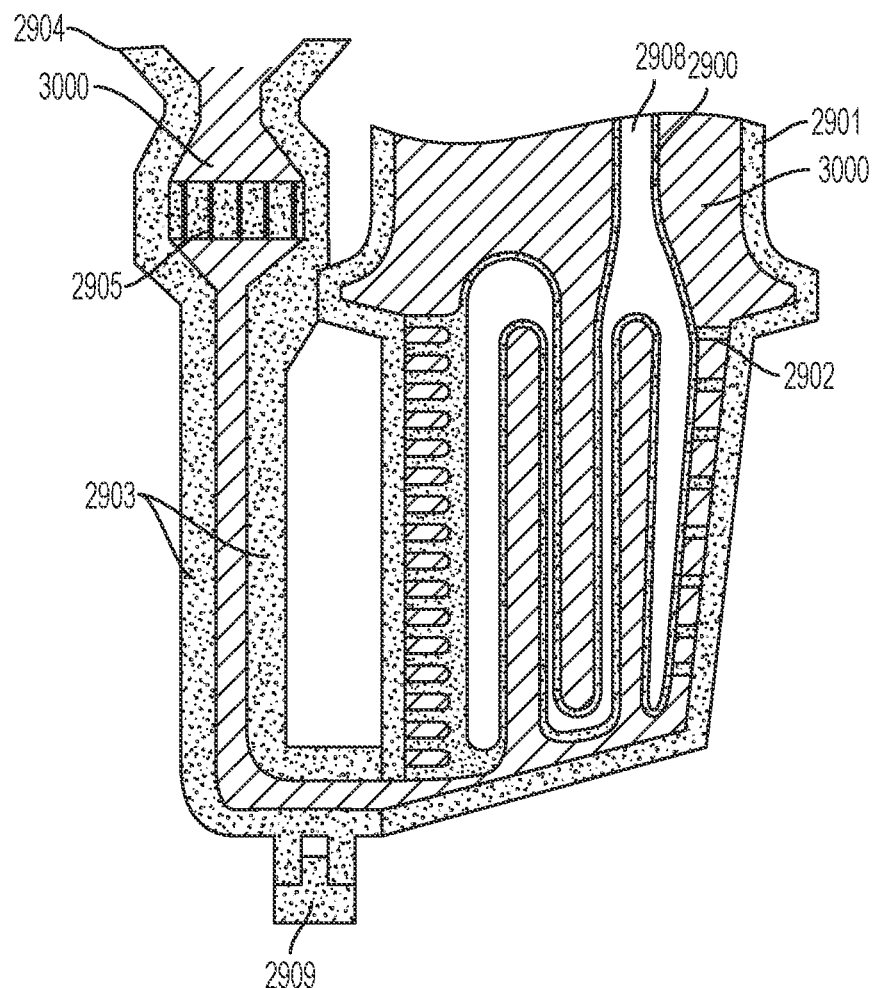
FIG. 30 shows the integrated filter of FIG. 29 after molten metal has been added to the filter.

FIG. 30 shows the integrated core-shell mold of FIG. 29 filled with cast metal 3000, such as a nickel based alloy, i.e., INCONEL®. After formation of the integrated core-shell mold and filter, the ceramic is cleaned by rinsing solvent through the port 2909. The port is then closed or plugged. The metal 3000 is filled into cavity 2907, while the hollow core cavity 2908 is left unfilled. After casting, the ceramic core 2900, shell 2901 and filaments 2902 are removed using a combination of chemical and mechanical processes. The hollow nature of the core 2900 allows for removal of the ceramic mold while minimizing the amount of chemical leaching needed. This saves time and reduces the potential for errors in the manufacturing process. As noted above, a solid core may be used in place of the hollow core if desired. Likewise, hollow filaments may be used in place of solid filaments.

Figure 31:
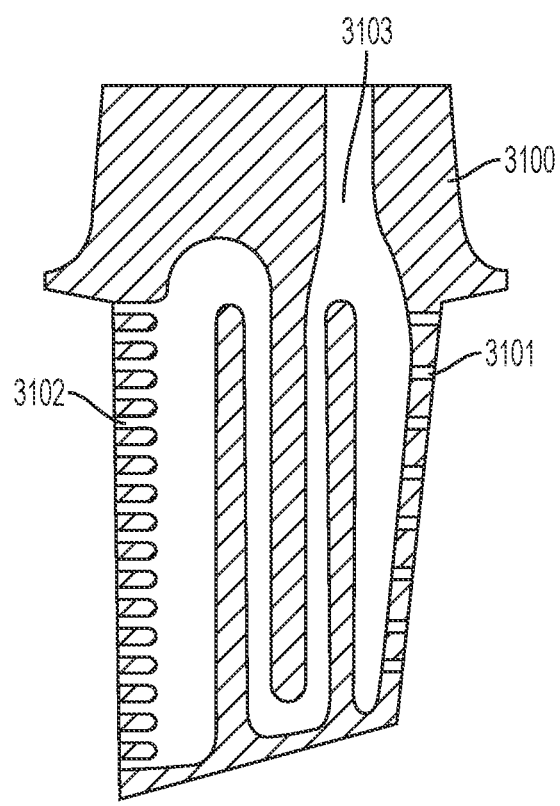
FIG. 31 shows a turbine blade produced using the integrated filter of FIG. 29.

Upon leaching of the ceramic core-shell, the resulting cast object is a turbine blade having a cooling hole pattern in the surface of the blade. It should be appreciated that although FIGS. 29-30 provide a cross sectional view showing cooling holes at the leading and trailing edge of the turbine blade, that additional cooling holes may be provided where desired including on the sides of the turbine blades or any other location desired. In particular, the present invention may be used to form cooling holes within the casting process in any particular design. In other words, one would be able to produce conventional cooling holes in any pattern where drilling was used previously to form the cooling holes. However, the present invention will allow for cooling hole patterns previously unattainable due to the limitations of conventional technologies for creating cooling holes within cast components, i.e., drilling. As noted above, the filaments may be used to hold the core in place during casting. In that case, the holes in the surface provided by the filaments can be closed using a brazing or equivalent operation. As shown in FIG. 30, the filter 2905 includes the metal 3000 poured through the funnel and through the filter. FIG. 31 shows a cast turbine blade 3100 with cooling holes 3101, 3102 connecting the blade surface to the hollow core 3103 of the blade.

Figure 32:
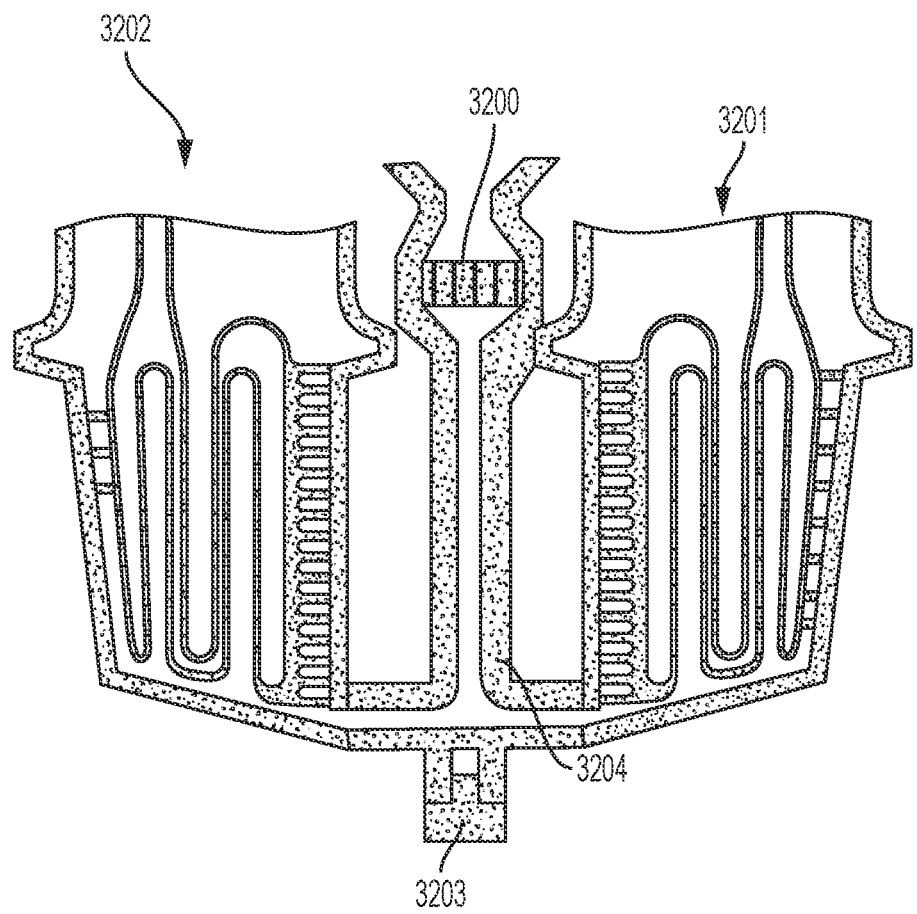
FIG. 32 shows a cross-section of a multiple blade ceramic mold tree where multiple blades share a common ceramic filter.

FIG. 32 shows an example where a filter element 3200 is oriented to filter molten metal before it enters a first cavity of a first turbine blade mold 3201 and a second cavity of a second turbine blade mold 3202. Additional turbine blade molds may be provided in a direction coming out of the page (not shown in the cross-sectional view that is provided). A port 3203 is located at the lowest portion of the metal supply tube 3204 for rinsing uncured ceramic polymer from the mold before filling with metal.

After leaching, the resulting holes in the turbine blade from the core print filaments may be brazed shut if desired. Otherwise the holes left by the core print filaments may be incorporated into the design of the internal cooling passages. Alternatively, cooling hole filaments may be provided to connect the tip plenum core to the shell in a sufficient quantity to hold the tip plenum core in place during the metal casting step.

After printing the core-shell mold structures in accordance with the invention, the core-shell mold may be cured and/or fired depending upon the requirements of the ceramic core photopolymer material. Molten metal may be poured into the mold to form a cast object in the shape and having the features provided by the integrated core-shell mold. In the case of a turbine blade or stator vane, the molten metal is preferably a superalloy metal that formed into a single crystal superalloy turbine blade or stator vane using techniques known to be used with conventional investment casting molds.

Figure 33:
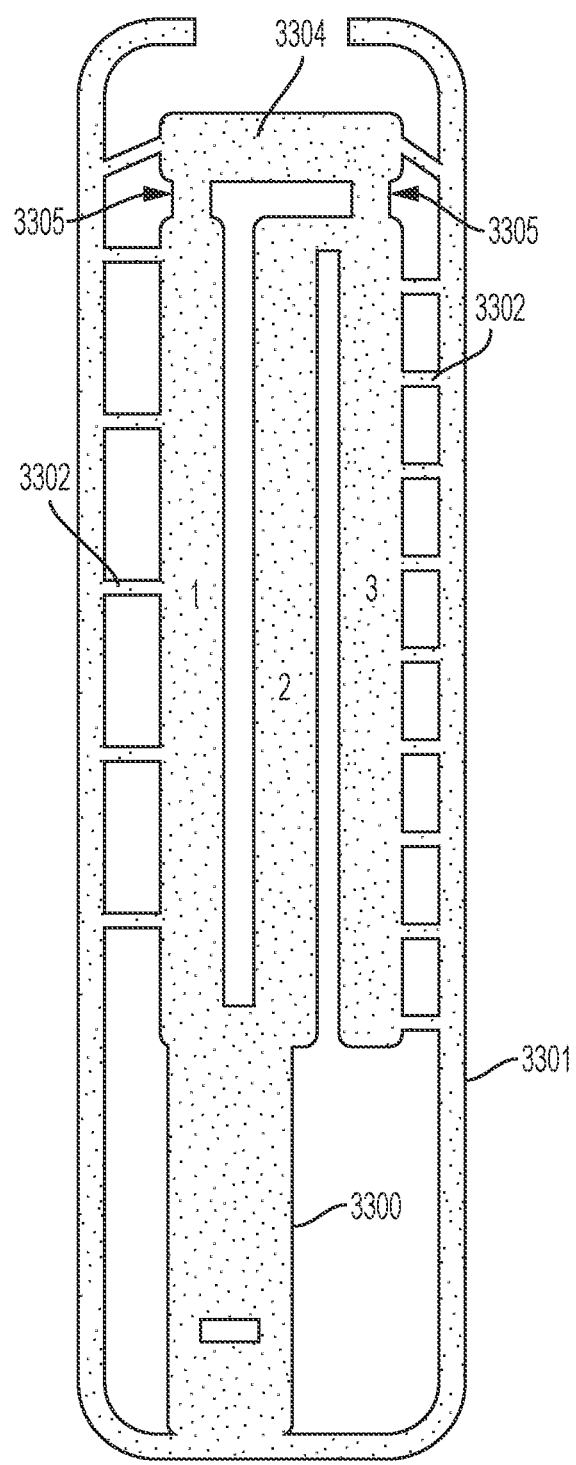
FIG. 33 shows a side view of an integrated core-shell mold with filaments connecting the core and shell portions.

FIG. 33 shows a schematic side view of an integrated core-shell mold with filaments 3302 connecting the core 3300 and shell portions 3301. By printing the ceramic mold using the above DLP printing process, the mold can be made in a way that allows the point of connections between the core and shell to be provided through filaments 3302. Once the core-shell mold is printed, it may be subject to a post-heat treatment step to cure the printed ceramic polymer material. The cured ceramic mold may then be used similar to the traditional casting process used in the production of superalloy turbine blades. Notably because the filaments 3302 are provided in a large quantity consistent with formation of a pattern of effusion cooling holes in the surface of a turbine blade, the need for a ball chute structure as shown in FIG. 2 may be eliminated. In this embodiment, the tip pins 3305 connecting the tip plenum core 3304 to the core 3300 are retained. After removal of the ceramic mold, tip holes exist between the core 3300 and tip plenum core 3304 that may be subsequently brazed shut. However, the tip pins 3305 may be eliminated, avoiding the need to braze shut tip holes connecting the core cavity with the tip plenum.

The filaments 3302 are preferably cylindrical or oval shape but may be curved or non-linear. Their exact dimensions may be varied according to a desired film cooling scheme for a particular cast metal part. For example cooling holes may have a cross sectional area ranging from 0.01 to 2 $mm^2$. In a turbine blade, the cross sectional area may range from 0.01 to 0.15 $mm^2$, more preferably from 0.05 to 0.1 $mm^2$, and most preferably about 0.07 $mm^2$. In the case of a vane, the cooling holes may have a cross sectional area ranging from 0.05 to 0.2 $mm^2$, more preferably 0.1 to 0.18 $mm^2$, and most preferably about 0.16 $mm^2$. The spacing of the cooling holes is typically a multiple of the diameter of the cooling holes ranging from 2× to 10× the diameter of the cooling holes, most preferably about 4-7× the diameter of the holes.

The length of the filament 3302 is dictated by the thickness of the cast component, e.g., turbine blade or stator vane wall thickness, and the angle at which the cooling hole is disposed relative to the surface of the cast component. The typical lengths range from 0.5 to 5 mm, more preferably between 0.7 to 1 mm, and most preferably about 0.9 mm. The angle at which a cooling hole is disposed is approximately 5 to 35° relative to the surface, more preferably between 10 to 20°, and most preferably approximately 12°. It should be appreciated that the methods of casting according to the present invention allow for formation of cooling holes having a lower angle relative to the surface of the cast component than currently available using conventional machining techniques.

The specific shape of a cooling hole made in accordance with the present invention is determined by the shape of the filament connecting the core to the shell portion of the mold. Because the process for making filaments allows complete control over the dimensions of the filament, the present invention can be used to make any shape cooling hole. Moreover, a single cast object may be provided with several kinds of cooling hole designs. The following describes several non-limiting examples for cooling hole designs that may be used in accordance with the present invention. One key characteristic of the cooling holes of the present invention is that they may be provided with a non-line-of-sight shape. In practice, cooling holes drilled through a completed turbine blade using electro discharge machining (EDM) were limited to cooling holes that were generally shaped to have a line of sight through the cast metal object. This is because the EDM apparatus has a generally linear shape and operates by drilling through outer surface of the cast object to reach the core cavity. It is generally not possible to drill from the core cavity side of the cast object because the core cavity is inaccessible.

Figure 34:
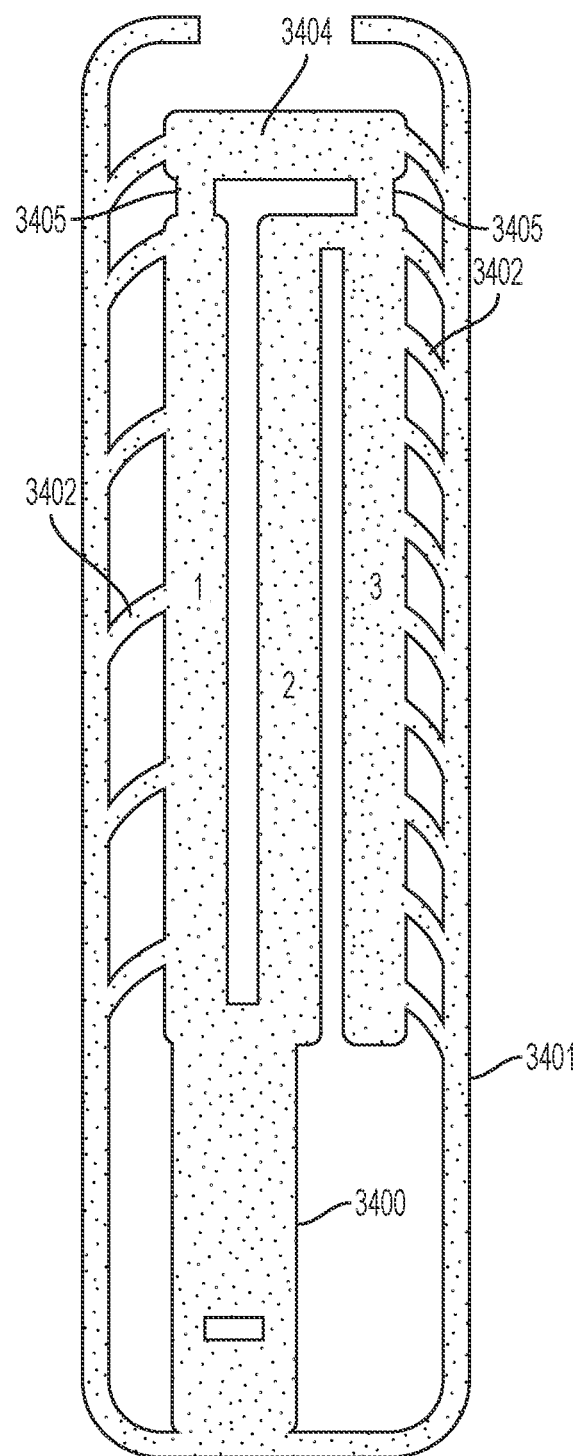
FIG. 34 shows a side view of an integrated core-shell mold with non-linear filaments connecting the core and shell portions.

FIG. 34 shows a schematic side view of an integrated core-shell mold with non-linear filaments 3402 in accordance with the present invention connecting the core 3400 and shell portions 3401. By printing the ceramic mold using the above DLP printing process, the mold can be made in a way that allows the point of connections between the core and shell to be provided through non-linear filaments 3402. Once the core-shell mold is printed, it may be subject to a post-heat treatment step to cure the printed ceramic polymer material. The cured ceramic mold may then be used similar to the traditional casting process used in the production of superalloy turbine blades. Notably because the non-linear filaments 3402 are provided in a large quantity consistent with formation of a pattern of effusion cooling holes in the surface of a turbine blade, the need for a ball chute structure as shown in FIG. 2 may be eliminated. In this embodiment, the tip pins 3405 connecting the tip plenum core 3404 to the core 3400 are retained. After removal of the ceramic mold, tip holes exist between the core 3400 and tip plenum core 3404 that may be subsequently brazed shut. However, the tip pins 3405 may be eliminated, avoiding the need to braze shut tip holes connecting the core cavity with the tip plenum.

The non-linear filaments 3402 are preferably cylindrical or oval shape. Their exact dimensions may be varied according to a desired film cooling scheme for a particular cast metal part. For example cooling holes may have a cross sectional area ranging from 0.01 to 2 $mm^2$. In a turbine blade, the cross sectional area may range from 0.01 to 0.15 $mm^2$, more preferably from 0.05 to 0.1 $mm^2$, and most preferably about 0.07 $mm^2$. In the case of a vane, the cooling holes may have a cross sectional area ranging from 0.05 to 0.2 $mm^2$, more preferably 0.1 to 0.18 $mm^2$, and most preferably about 0.16 $mm^2$. The spacing of the cooling holes is typically a multiple of the diameter of the cooling holes ranging from 2× to 10× the diameter of the cooling holes, most preferably about 4-7× the diameter of the holes.

The length of the filament 3402 is dictated by the thickness of the cast component, e.g., turbine blade wall thickness, and the angle at which the cooling hole is disposed relative to the surface of the cast component. The typical lengths range from 0.5 to 5 mm, more preferably between 0.7 to 1 mm, and most preferably about 0.9 mm. The angle at which a cooling hole is disposed is approximately 5 to 35° relative to the surface, more preferably between 10 to 20°, and most preferably approximately 12°. It should be appreciated that the methods of casting according to the present invention allow for formation of cooling holes having a lower angle relative to the surface of the cast component that currently available using conventional machining techniques.

The present invention relates also to methods of making cast metal objects, in particular single crystal turbine blades and stators used in jet aircraft engines that have non-linear cooling holes such as the exemplary design shown in FIG. 34. The method begins with the production of the ceramic mold using DLP. The DLP process involves a repetition of steps of (a) contacting a cured portion of a workpiece with a liquid ceramic photopolymer; (b) irradiating a portion of the liquid ceramic photopolymer adjacent to the cured portion through a window contacting the liquid ceramic photopolymer; and (c) removing the workpiece from the uncured liquid ceramic photopolymer. The steps (a)-(c) are repeated until the ceramic mold shown in FIG. 34 is formed. After the mold is formed, liquid metal may then be poured into the casting mold and solidified to form the cast component. The ceramic mold is then removed from the cast component using, for example, combination of mechanical removal of the outer shell and leaching of the inner ceramic core.

The specific geometry of the non-linear cooling hole filaments shown in FIG. 34 may be varied based on the needs for specific effusion cooling hole pattern to be placed in the turbine blade or stator. For example, the direction of the hole may be opposite that shown in FIG. 34 with holes aligned toward the top of the turbine blade. The filament may have a curvature that forms an "S" shaped hold upon removal of the mold. Alternatively, the holes may be aligned horizontally along the turbine blade such that they project inward or alternatively outward of the page. Given the flexibility possible for DLP processing, there are no limitations on the shape of the cooling hole. A few alternative exemplary cooling hole geometries are shown in FIGS. 35 and 36.

Figure 35:
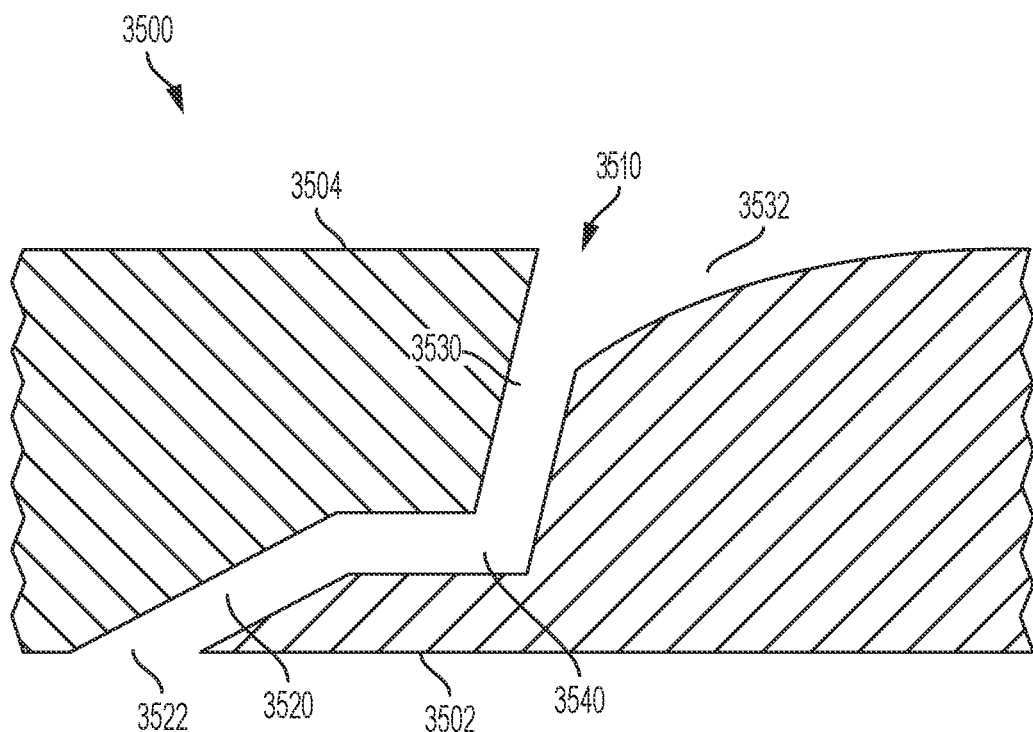
FIG. 35 shows a side view of a non-linear cooling hole in accordance with one aspect of the invention.

FIG. 35 shows a side view of a non-linear cooling hole that can be made in a cast object in accordance with one aspect of the invention. In this example, the effusion cooling hole 3510 extends from the inner surface 3502 of the cast component 3500 to the outer surface 3504 of the cast component 3500. The cooling hole 3510 has an upstream portion 3520 with an inlet 3532, an intermediate portion 3540, and a downstream portion 3530 with an outlet 3522. The cooling hole 3510 has a non-linear line of sight, meaning that no virtual, single straight line segment may be extended between the inlet 3522 and outlet 3532, given the areas of the inlet 3522 and outlet 3532, and the diameters, shapes, and angles of the respective portions 3520, 3530. The exemplary cooling hole geometry may be implemented by printing a filament in the reverse pattern of the cooling hole within a core-shell assembly such as shown in FIG. 34.

Figure 36:
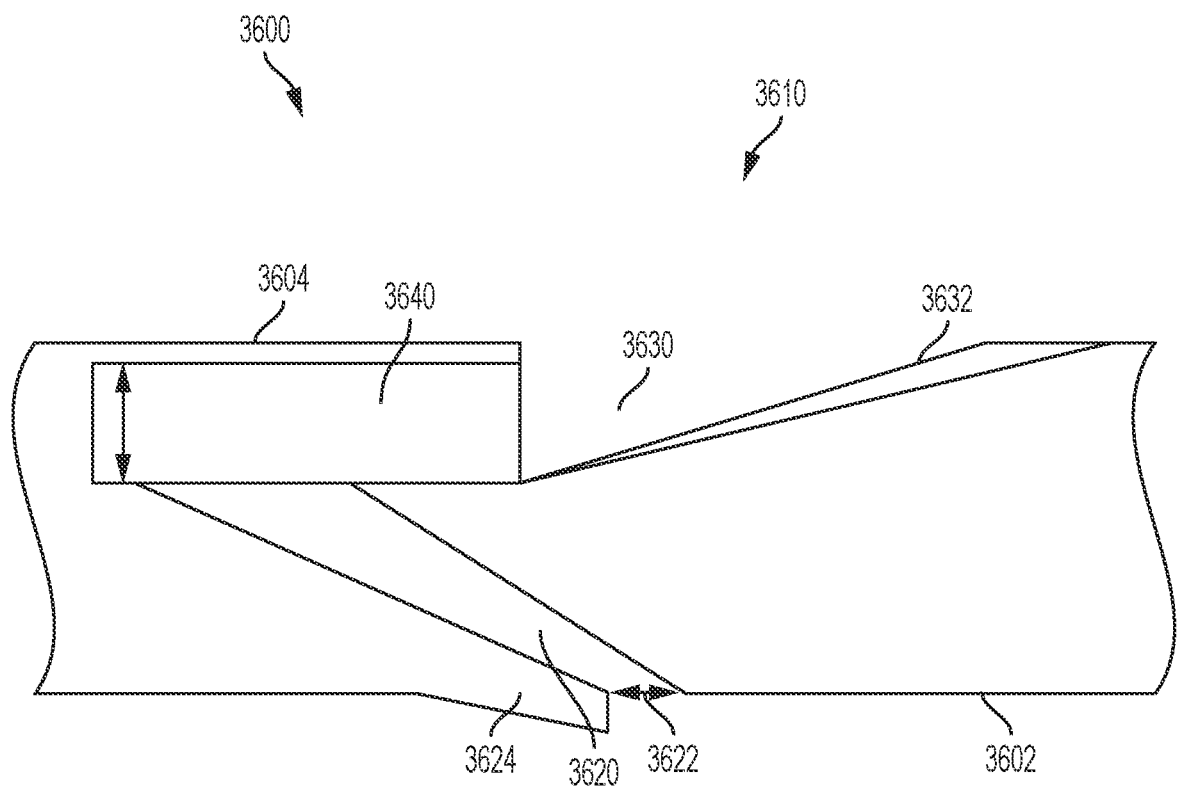
FIG. 36 shows a side view of a non-linear cooling hole in accordance with one aspect of the invention.

FIG. 36 shows an effusion cooling hole 3610 in accordance with an embodiment of the invention. The cooling hole 3610 extends from the inner surface 3602 of the cast component 3600, through the cast component 3600, to an outer surface 3604 of the cast component 3600. The cooling hole 3610 extends from an upstream portion 3620 with an inlet 3622, through a chamber 3640, to a downstream portion 3630 with an outlet 3632 to the outer surface of the cast object. The cooling hole 3610 of the present invention may have a chamber 3640 that is defined by having at least one height or width dimension that is greater than the minimum diameter of the inlet 3620. The cooling hole may have a ramp structure 3624 adjacent to the inlet 3620.

The chamber 3640 is designed to provide additional heat transfer capability to the cooling holes while serving as a trap for dust and particulate matter that makes its way into the supply of cooling air. This can be particularly advantageous when operating a jet aircraft in dusty or sandy environments. Preventing dust or sand from entering the flowpath can add useful life to downstream engine parts that may be damaged over time by dust or sand contamination. For example, turbine blades and stators in the low pressure turbine region of the jet aircraft engine may benefit from reduced contamination. In addition the ramp structure 3624 can optionally be included in the design to further reduce contamination by sand or dust.

After leaching, the resulting holes in the turbine blade from the core print filaments may be brazed shut if desired. Otherwise the holes left by the core print filaments may be incorporated into the design of the internal cooling passages. Alternatively, cooling hole filaments may be provided to connect the tip plenum core to the shell in a sufficient quantity to hold the tip plenum core in place during the metal casting step After printing the core-shell mold structures in accordance with the invention, the core-shell mold may be cured and/or fired depending upon the requirements of the ceramic core photopolymer material. Molten metal may be poured into the mold to form a cast object in the shape and having the features provided by the integrated core-shell mold. In the case of a turbine blade, the molten metal is preferably a superalloy metal that formed into a single crystal superalloy turbine blade using techniques known to be used with conventional investment casting molds.

Figure 37:
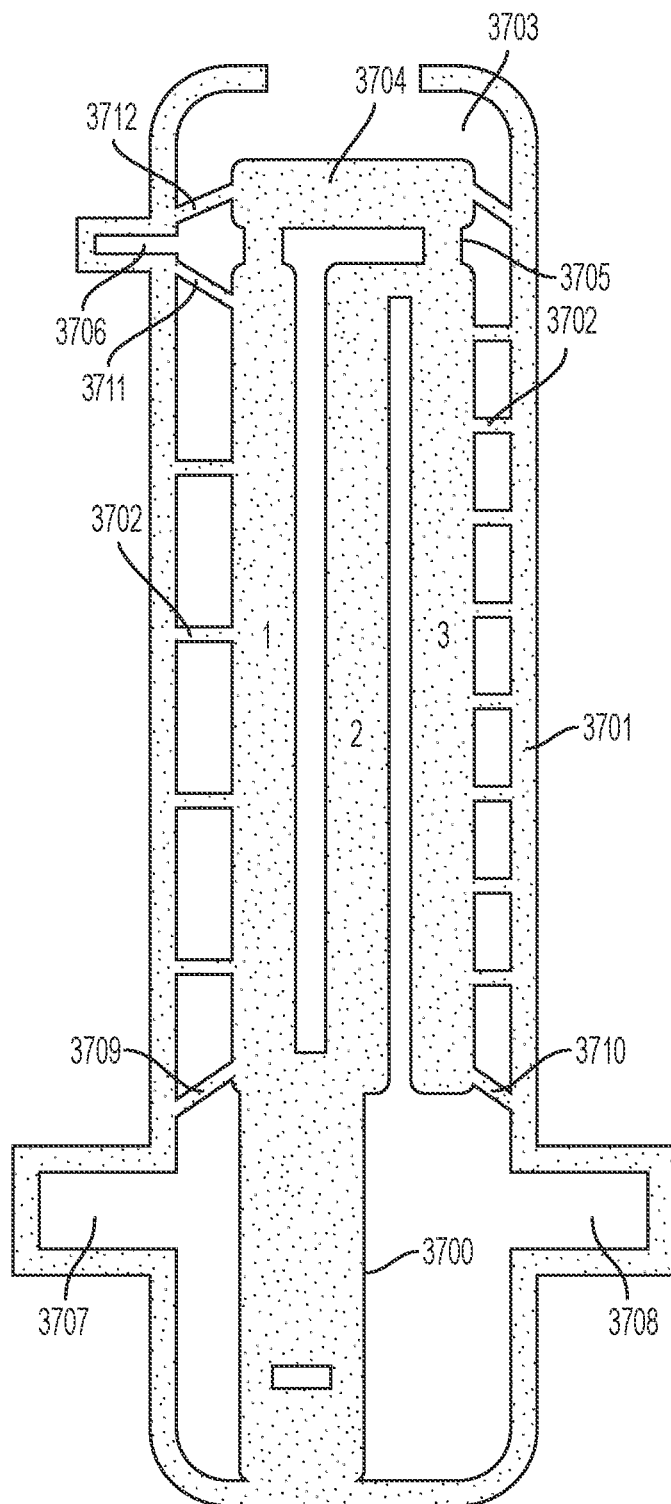
FIG. 37 shows a side view of an integrated core-shell mold with linear filaments connecting the core and shell portions.

FIG. 37 shows a schematic side of an integrated core-shell mold having horizontal filaments 3702 and sloping or diagonal filaments (e.g. 3709, 3710, 3711, 3712) connecting the core 3700 and the shell portions 3701 according to one embodiment of the present invention. By printing the ceramic mold using the above DLP printing process, the mold can be made in a way that allows the point of connections between the core and the shell to be provided through the filaments. Once the core-shell mold is printed, it may be subject to a post-heat treatment step to cure the printed ceramic polymer material. The cured ceramic mold may then be used similar to the traditional casting process used in the production of superalloy turbine blades. Notably, because the filaments are provided in a large quantity consistent with formation of a pattern of effusion cooling holes in the surface of a turbine blade, the need for a ball chute structure in FIG. 2 may be eliminated. The tip pins 3705 connecting the tip plenum core 3704 to the core 3700 may be retained. After removal of the ceramic mold, tip holes exist between the core 3700 and the tip plenum core 3704 that may be subsequently brazed shut. At the tip portion of the integrated core-shell mold, there exists a void or space 3703 between the shell 3701 and the tip plenum core 3704.

As shown in FIG. 37, the core 3700 further includes several protrusion patterns that that extend away from the center of the mold, such as but not limited to protrusion pattern 3706 which is connected to and is an extension of the shell 3701 at the tip portion of the mold and protrusion patterns 3707, 3708 that extend away from the center of the mold in opposing directions at the base portion of the mold.

The filaments 3702, 3709, 3710, 3711 and 3712 are preferably cylindrical or oval shape but may also be curved or non-linear. Their exact dimensions may be varied according to a desired film cooling scheme for a particular cast metal part. For example cooling holes may have a cross sectional area ranging from 0.01 to 2 mm$^2$. In a turbine blade, the cross sectional area may range from 0.01 to 0.15 mm$^2$, more preferably from 0.05 to 0.1 mm$^2$, and most preferably about 0.07 mm$^2$. In the case of a vane, the cooling holes may have a cross sectional area ranging from 0.05 to 0.2 mm$^2$, more preferably 0.1 to 0.18 mm$^2$, and most preferably about 0.16 mm$^2$. The spacing of the cooling holes is typically a multiple of the diameter of the cooling holes ranging from 2× to 10× the diameter of the cooling holes, most preferably about 4-7× the diameter of the holes.

The length of the filament 3702 is dictated by the thickness of the cast component, e.g., turbine blade wall thickness, and the angle at which the cooling hole is disposed relative to the surface of the cast component. The typical lengths range from 0.5 to 5 mm, more preferably between 0.7 to 1 mm, and most preferably about 0.9 mm. The angle at which a cooling hole is disposed is approximately 5 to 35° relative to the surface, more preferably between 10 to 20°, and most preferably approximately 12°. It should be appreciated that the methods of casting according to the present invention allow for formation of cooling holes having a lower angle relative to the surface of the cast component than currently available using conventional machining techniques.

Figure 38:
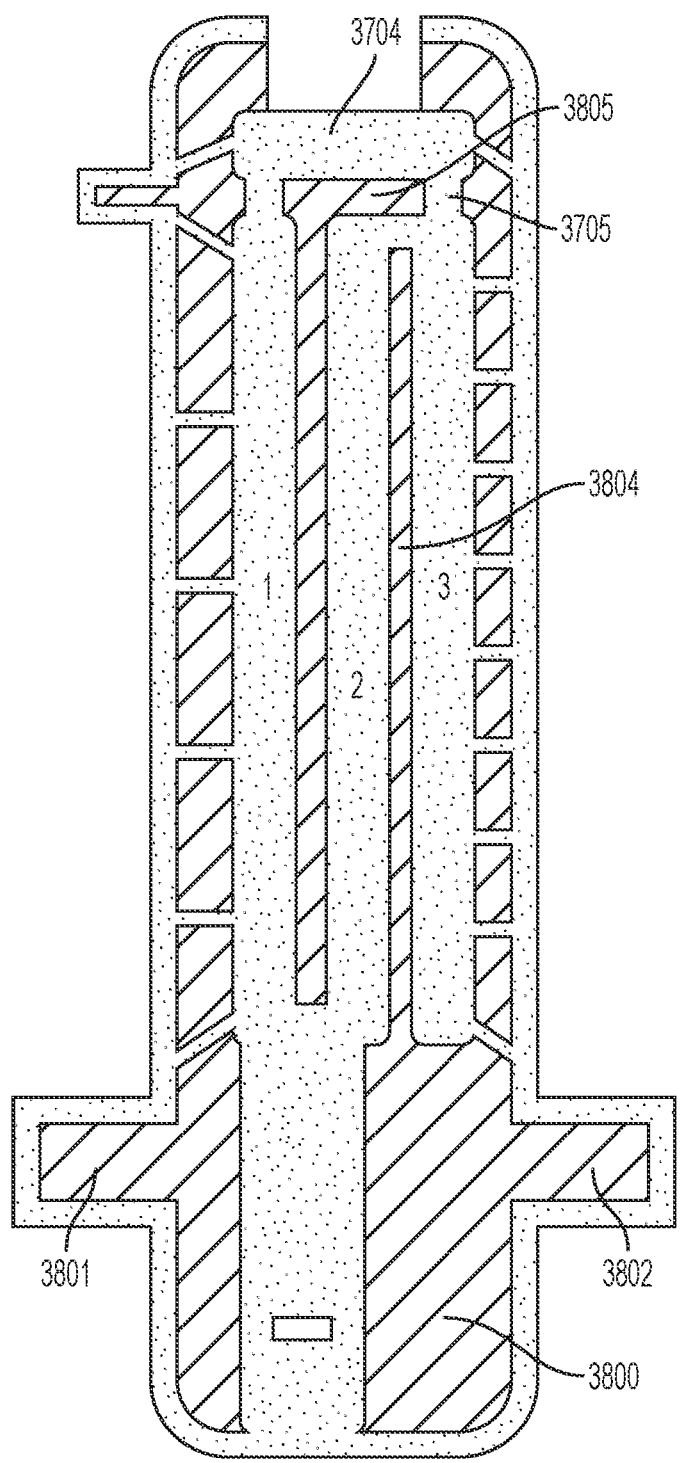
FIG. 38 shows a side view of a metal-filled integrated core-shell mold according to an embodiment of the present invention.

FIG. 38 shows a side view of an integrated core-shell mold filled with liquid metal to cast a turbine blade and the turbine blade formed after the metal solidifies and the mold is removed. The turbine blade formed includes at least a root portion 3800, an inner vertical surface 3804, an inner horizontal surface 3805 at the tip portion of the blade and a plurality of cooling holes along the entire height or length of the blade (excluding the root portion 3800) and on both the front and back sides of the blade (i.e. the outer surfaces of the blade). Notably, the turbine blade in accordance with the present invention further includes an overhang in the tip portion of the blade and outer portions 3801, 3802 in the root portion 3800 which form at least part of a root component (i.e. blade skirt) or trailing edge of the turbine blade.

Figure 39:
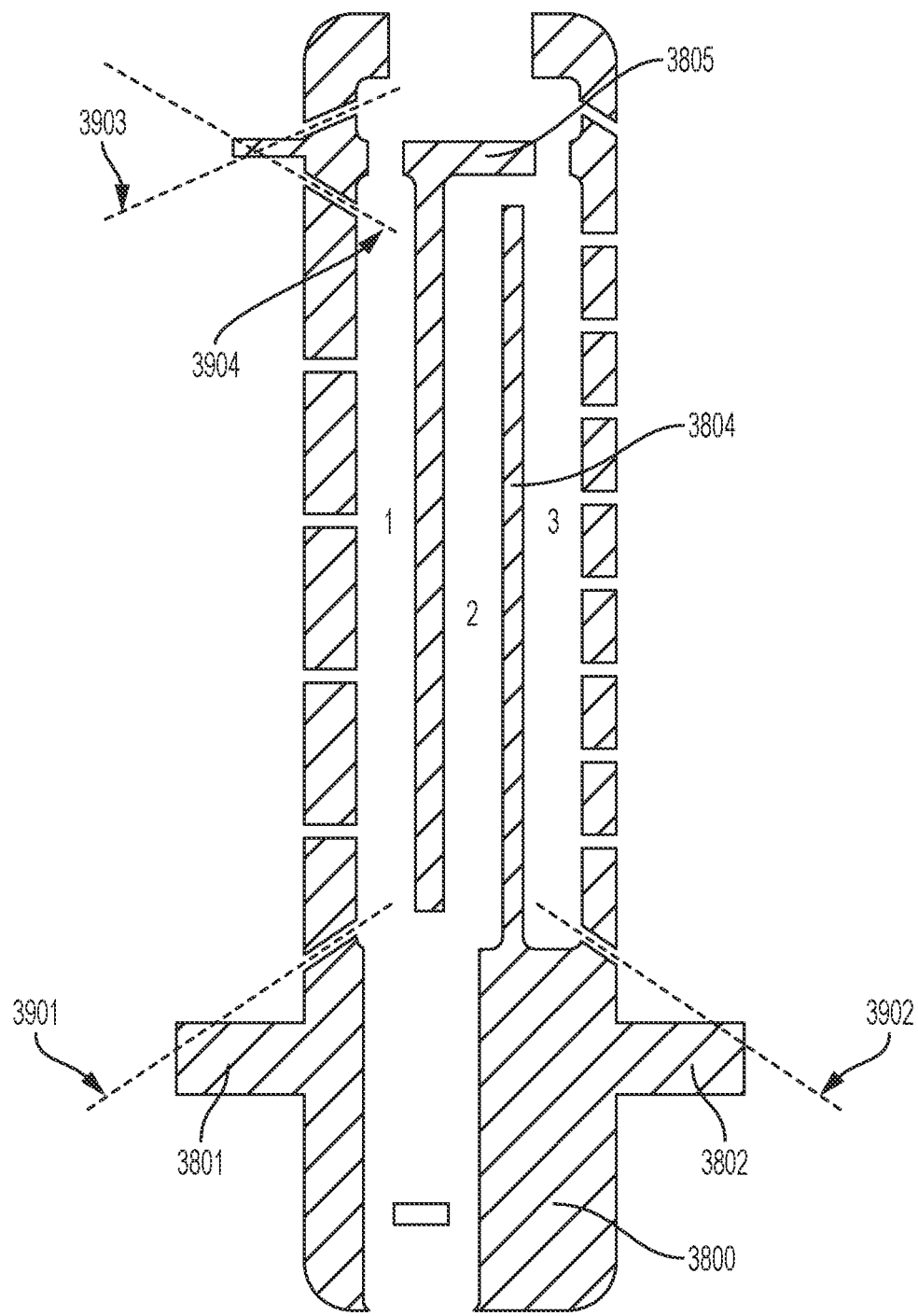
FIG. 39 shows a side view of a superalloy turbine blade formed after removal of the integrated core-shell mold in accordance with one aspect of the invention.

It should be appreciated that the methods of casting and the integrated core-shell mold according to the present invention allow for formation of cooling holes in inaccessible or unattainable locations, which are locations on the external walls of the turbine blade that are proximal to the aforementioned overhang and outer portions, as can be seen in FIG. 39. Specifically, these cooling holes are diagonal or sloping and are located such that an imaginary line (e.g. 3901, 3902, 3903, 3904) joining a first point at the intersection of the cooling hole with the inner cavity and a second point at the intersection of the cooling hole with the outer surface intersects an overhang or an outer portion of the turbine blade. The intersection between the imaginary line and the overhang or the outer portion is further away from the center of the turbine blade than the second point. The only way these cooling holes can be formed on a turbine blade manufactured using conventional casting techniques would be destructively drilling the holes through the metal blade.

After leaching, the resulting holes in the turbine blade from the core print filaments may be brazed shut if desired. Otherwise the holes left by the core print filaments may be incorporated into the design of the internal cooling passages. Alternatively, cooling hole filaments may be provided to connect the tip plenum core to the shell in a sufficient quantity to hold the tip plenum core in place during the metal casting step. After printing the core-shell mold structures in accordance with the invention, the core-shell mold may be cured and/or fired depending upon the requirements of the ceramic core photopolymer material. Molten metal may be poured into the mold to form a cast object in the shape and having the features provided by the integrated core-shell mold. In the case of a turbine blade, the molten metal is preferably a superalloy metal that formed into a single crystal superalloy turbine blade using techniques known to be used with conventional investment casting molds.

Figure 40:
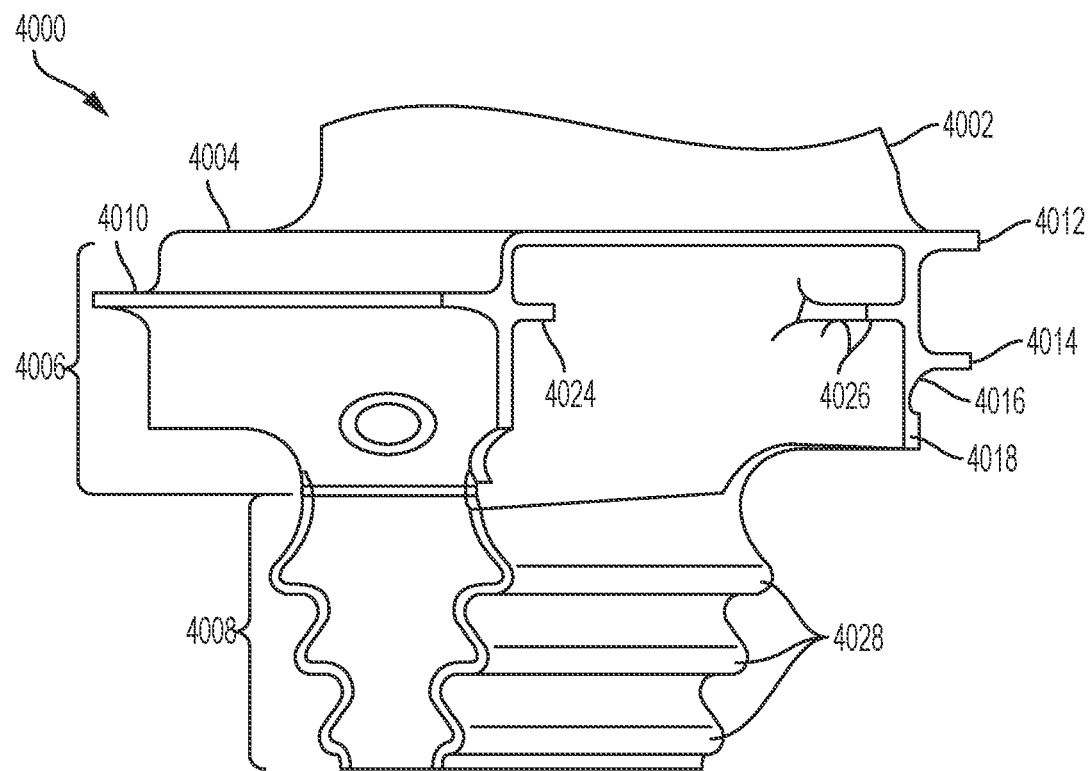
FIG. 40 shows a perspective view of a prior art turbine blade root portion.

U.S. Pat. No. 9,039,382, entitled "Blade Skirt" describes a turbine blade include details of the blade root. The blade 4000 as shown in FIG. 40 typically has an airfoil 4002, a platform 4004, a shank 4006, and a multi-lobe dovetail 4008 having a fir tree configuration 4028. On the forward side of the blade 4000, there is a forward angel wing 4010. On the aft side of the blade 4000, there is a distal aft angel wing 4012 radially inward of that is a proximal aft angel wing 4014 with a gap therebetween. Proximal of the aft proximal angel wing 4014, there is a fillet 4016 that blends into a blade skirt 4018. A recess may be provided within the shank portion 4006 between the forward and aft sides of the blade 4000. Within that recess, there is a forward damper retention lug 4024 and an aft damper retention lug 4026, which are used in conjunction with one another to retain a damper (not shown). The dovetail section 4008 is inserted in a rotor (not shown) such that the dovetail lobes 4028 mate with the rotor to radially fix the blade in place.

During the investment casting process, the entire structure shown in FIG. 40 is prepared in wax form, and then the ceramic shell is formed over the wax. Unless projecting features (i.e., angel wing, blade skirt, damper lugs) in the root portion of the turbine blade are made sufficiently thick, these features will deform upon removal from the wax mold, during handling of the wax, during handling of the final metal part, or while forming the ceramic shell. For example, the minimum dimension of angel wings, skirts and damper lugs must be greater than 25 mils (0.64 mm), preferably greater than 30 mils (0.8 mm).

The present inventors recognized that prior processes known for making turbine blades and stator vanes i.e. investment casting, lacked the fine resolution capability necessary to produce turbine blades and vanes having thin blade root elements. In particular, the wax processing step in investment casting severely limits the ability to manufacture turbine blades where the blade or vane root elements may be made as thin or as fine as desired.

The present inventors have found that the integrated core-shell mold of the present invention can be manufactured using direct light processing (DLP). DLP differs from powder bed and SLA processes in that the light curing of the polymer occurs through a window at the bottom of a resin tank that projects light upon a build platform that is raised as the process is conducted. With DLP an entire layer of cured polymer is produced simultaneously, and the need to scan a pattern using a laser is eliminated. Further, the polymerization occurs between the underlying window and the last cured layer of the object being built. The underlying window provides support allowing thin filaments of material to be produced without the need for a separate support structure. In other words, producing a thin filament of material bridging two portions of the build object is difficult and was typically avoided in the prior art. For example, U.S. Pat. No. 8,851,151 assigned to Rolls-Royce Corporation describes a 3-D printing method of producing a ceramic core-shell mold that used vertical plate structures connected with short cylinders, the length of which was on the order of their diameter. Staggered vertical cavities are necessitated by the fact that the powder bed and SLA techniques disclosed in the '151 patent require vertically supported ceramic structures and the techniques are incapable of reliably producing thin indentations or recesses that correspond to thin turbine blade root components (i.e. angel wings, damper lugs, skirts) of the cast turbine blade. In addition, the available resolution within a powder bed is on the order of ⅛" (3.2 mm) making the production of thin turbine blade root components impracticable. For example, these thin turbine blade root components generally have a minimum dimension of less 0.64 mm, preferably in the range of 0.1 to 0.6 mm, more preferably in the range of 0.2 to 0.5 mm. As used herein, the term "minimum dimension" means "smallest possible dimension". Production of a turbine blade root component of such dimensions requires a resolution simply not available in a powder bed process. Similarly, stereolithography is limited in its ability to produce such thin indentations due lack of support and resolution problems associated with laser scattering. But the fact that DLP exposes the entire length of the indentation and supports it between the window and the build plate enables producing sufficiently thin indentations having the desired minimum dimensions. Although powder bed and SLA may be used to produce indentations, their ability to produce sufficiently fine indentations as discussed above is limited.

Figure 41:
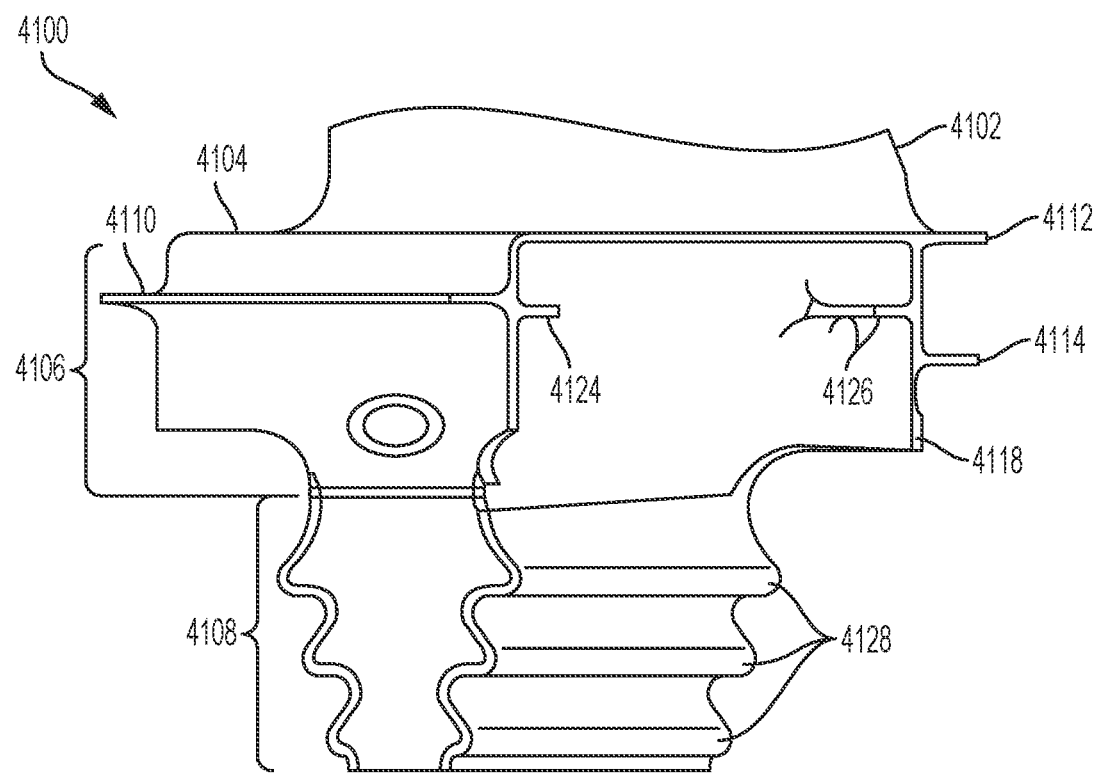
FIG. 41 shows a perspective view of a turbine blade root portion made in accordance with an embodiment of the present invention.

The present invention may be used to make turbine blades and stator vanes having root feature minimum dimensions of less than 0.64 mm. As shown in FIG. 41, the blade 4100 includes an airfoil 4102, a platform 4104, a shank 4106, and a multi-lobe dovetail 4108 having a fir tree configuration 4128. The angel wings 4110, 4112 and 4114, skirt 4118, and damper retention lugs 4124, 4126 preferably have a thickness of less than 0.64 mm. In general angel wings may range in thickness from 0.1 to 0.6 mm, more preferably in the range of 0.2 and 0.5 mm. The thinner dimensions of the turbine blade or vane root features allows for a significant reduction in weight and enables novel designs. It will be appreciated that the specific design of the blade shown in FIG. 41 is for illustrative purposes only and in no way limits the invention. It should be noted that turbine blades and vanes generally have root features and that those turbine blade or vane designs may be prepared using the present methods in order to achieve a reduction in weight.

After printing the core-shell mold structures in accordance with the invention, the core-shell mold may be cured and/or fired depending upon the requirements of the ceramic core photopolymer material. Molten metal may be poured into the mold to form a cast object in the shape and having the features provided by the integrated core-shell mold. In the case of a turbine blade or stator vane, the molten metal is preferably a superalloy metal that formed into a single crystal superalloy turbine blade or stator vane using techniques known to be used with conventional investment casting molds.

In an aspect, the present invention relates to the core-shell mold structures of the present invention incorporated or combined with features of other core-shell molds produced in a similar manner. The following patent applications include disclosure of these various aspects and their use:

U.S. patent application Ser. No. 15/377,728, titled "INTEGRATED CASTING CORE-SHELL STRUCTURE", and filed Dec. 13, 2016;

U.S. patent application Ser. No. 15/377,711, titled "INTEGRATED CASTING CORE-SHELL STRUCTURE WITH FLOATING TIP PLENUM", and filed Dec. 13, 2016;

U.S. patent application Ser. No. 15/377,796, titled "MULTI-PIECE INTEGRATED CORE-SHELL STRUCTURE FOR MAKING CAST COMPONENT", and filed Dec. 13, 2016;

U.S. patent application Ser. No. 15/377,746, titled "MULTI-PIECE INTEGRATED CORE-SHELL STRUCTURE WITH STANDOFF AND/OR BUMPER FOR MAKING CAST COMPONENT", and filed Dec. 13, 2016;

U.S. patent application Ser. No. 15/377,673, titled "INTEGRATED CASTING CORE SHELL STRUCTURE WITH PRINTED TUBES FOR MAKING CAST COMPONENT", and filed Dec. 13, 2016;

U.S. patent application Ser. No. 15/377,759, titled "INTEGRATED CASTING CORE-SHELL STRUCTURE AND FILTER FOR MAKING CAST COMPONENT", and filed Dec. 13, 2016;

U.S. patent application Ser. No. 15/377,787, titled "INTEGRATED CASTING CORE SHELL STRUCTURE FOR MAKING CAST COMPONENT WITH NON-LINEAR HOLES", and filed Dec. 13, 2016;

U.S. Pat. No. 10,807,154, titled "INTEGRATED CASTING CORE SHELL STRUCTURE FOR MAKING CAST COMPONENT WITH COOLING HOLES IN INACCESSIBLE LOCATIONS", and filed Dec. 13, 2016;

U.S. patent application Ser. No. 15/377,766, titled "INTEGRATED CASTING CORE-SHELL STRUCTURE FOR MAKING CAST COMPONENTS HAVING THIN ROOT COMPONENTS", and filed Dec. 13, 2016.

The disclosures of each of these applications are incorporated herein in their entireties to the extent they disclose additional aspects of core-shell molds and methods of making that can be used in conjunction with the core-shell molds disclosed herein.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

The invention claimed is:

1. A ceramic casting mold, comprising:
   a first core portion and a first shell portion, the first core portion and the first shell portion monolithically linked together with filaments;
   a second core portion and a second shell portion, the second core portion and the second shell portion monolithically linked together with filaments;
   wherein the first core portion and the first shell portion are adapted to interface with at least the second core portion and the second shell portion to form the ceramic casting mold, the ceramic casting mold comprising a cavity between the first and second core portions and the first and second shell portions, the cavity adapted to define a cast component upon casting and removal of the ceramic casting mold.

2. The ceramic casting mold of claim 1, wherein the cast component is a turbine blade or a stator vane.

3. The ceramic casting mold of claim 1, wherein the first core portion or the first shell portion includes at least one interlocking feature adapted to interface with an interlocking feature on the second core portion or second shell portion.

4. The ceramic casting mold of claim 3, wherein the interlocking feature is an interlocking tongue or groove adapted to fasten with a second partial ceramic casting mold.

5. The ceramic casting mold of claim 3, wherein the interlocking feature is an interlocking dovetail adapted to fasten with a second partial ceramic casting mold.

6. The ceramic casting mold of claim 3, wherein the interlocking feature is a rabbet joint with an interlocking peg adapted to fasten with a second partial ceramic casting mold.

7. The ceramic casting mold of claim 1, wherein the first shell portion comprises a pin support or bumper facing the first core portion.

8. The ceramic casting mold of claim 1, wherein the first core portion comprises a pin support or bumper which abuts the first core portion upon assembly of the first core and first shell portions.

9. The ceramic casting mold of claim 1, wherein the ceramic mold comprises a plurality of tie structures joining the first core portion and the first shell portion, the tie structures adapted to define a plurality of holes in the cast component upon removal of the mold.

10. A ceramic casting mold comprising:
    a core portion and a shell portion with at least one cavity between the core portion and the shell portion, the core portion and the shell portion comprising a photopolymerized material, the at least one cavity adapted to define a shape of a cast component upon casting and removal of the ceramic casting mold;
    at least one filament comprising the photopolymerized material, the at least one filament spanning between and joining the core portion and the shell portion to form a monolithic, one piece core-shell mold of the ceramic casting mold.

11. The ceramic casting mold of claim 10, wherein the at least one filament comprises a plurality of filaments comprising the photopolymerized material, the plurality of filaments spanning between and joining the core portion and the shell portion to form the monolithic, one piece core-shell mold and adapted to define a plurality of holes providing fluid communication between a cavity within the cast component defined by the core portion and an outer surface of the cast component upon removal of the ceramic casting mold.

12. The ceramic casting mold of claim 11, wherein the cast component is a turbine blade or a stator vane and the plurality of filaments joining the core portion and the shell portion define a plurality of cooling holes in the turbine blade or the stator vane upon removal of the ceramic casting mold.

13. The ceramic casting mold of claim 11, further comprising:
    a filter portion oriented in a path of molten metal flowing into the at least one cavity of the ceramic casting mold, the filter portion comprising a ceramic filter.

14. The ceramic casting mold of claim 13, wherein the ceramic filter is a cylindrical-shaped filter comprising an inlet surface, an outlet surface, and one or more openings providing a pathway for liquid metal to pass from the inlet surface through the ceramic filter and through the outlet surface.

15. The ceramic casting mold of claim 14, wherein the one or more openings comprise at least 60% to about 90% of a total volume of the ceramic filter.

16. The ceramic casting mold of claim 11, wherein the at least one filament comprises at least a portion having a non-linear geometry and a cross sectional area ranging from 0.01 millimeters (mm) to 2 mm$^2$.

17. The ceramic casting mold of claim 16, wherein the non-linear geometry forms an S-shaped hole upon removal of the mold.

18. The ceramic casting mold of claim 17, wherein an outlet of the S-shaped hole exits a surface of the cast component at an angle in the range of 5° to 20°.

19. The ceramic casting mold of claim 18, wherein the interlocking feature comprises an interlocking tongue, groove, or dovetail adapted to fasten with a second ceramic casting mold.

20. The ceramic casting mold of claim 17, wherein the first core portion or the first shell portion comprises at least one interlocking feature adapted to interface with an interlocking feature on the second core portion or second shell portion.

21. The ceramic casting mold of claim 17, wherein the ceramic casting mold comprises a plurality of tie structures joining the first core portion and first shell portion or joining the second core portion and second shell portion, the tie structures adapted to define a plurality of holes in the cast component upon removal of the ceramic casting mold.

22. The ceramic casting mold of claim 11, wherein at least a portion of the plurality of filaments and/or the core portion is in a shape of a hollow tube.

23. The ceramic casting mold of claim 11, wherein an outer diameter of the plurality of filaments ranges from about 0.01 millimeters (mm) to about 2 $mm^2$.

24. The ceramic casting mold of claim 23, wherein the cross sectional area defined by the inner diameter of the hollow tube is at least 50% of the outer diameter of the plurality of filaments.

25. The ceramic casting mold of claim 11, wherein the core portion includes a first core portion and a second core portion, and wherein the shell portion includes a first shell portion and a second shell portion, the first core portion and the first shell portion adapted to interface with the second core portion and the second shell portion and the plurality of filaments spanning between and joining the first core portion to the first shell portion and the second core portion to the second shell portion to form a two-piece integrated core-shell ceramic casting mold comprising the at least one cavity between the first and second core portions and the first and second shell portions.

26. The ceramic casting mold of claim 25, wherein the first core portion or the first shell portion further comprises at least one standoff feature comprising the photopolymerized material that protrudes into the at least one cavity between the first core portion and first shell portion and that is adapted to provide a minimum spacing between the first core portion and first shell portion.

27. The ceramic casting mold of claim 10, wherein the core portion is defined by a core hollow tube structure having an inner diameter and an outer diameter, the core hollow tube structure further comprising a hollow core having a cross sectional area that is at least 80% of a cross sectional area defined by the outer diameter.

28. The ceramic casting mold of claim 10, wherein the at least one cavity defines a turbine blade or a vane root component having a minimum dimension in the range of 0.1 millimeters (mm) to 0.64 mm.

29. The ceramic casting mold of claim 10, wherein the at least one filament intersects the core portion at a first point and the at least one filament intersects the shell portion at a second point, and an imaginary line joining the first point and the second point intersects an outer portion of the at least one cavity that extends further away from the center of the mold than the second point.

30. The ceramic casting mold of claim 10, wherein the core portion comprises a main core portion and a core tip portion with the at least one cavity between the main core portion and the shell portion, and the at least one filament comprises at least one ceramic tip filament comprising the photopolymerized material connecting the core tip portion and the shell portion to form the monolithic, one piece core-shell mold.

31. The ceramic casting mold of claim 10, wherein the first core portion or the first shell portion further comprises at least one standoff feature comprising the photopolymerized material that protrudes into the at least one cavity between the first core portion and first shell portion and that is adapted to provide a minimum spacing between the first core portion and first shell portion.

32. The ceramic casting mold of claim 31, wherein the at least one standoff feature is a bumper or a pin.

33. The ceramic casting mold of claim 32, wherein the at least one bumper or pin is formed via additive manufacturing and is formed integrally with at the first core portion, the first shell portion, a second core portion, or a second shell portion.

34. The ceramic casting mold of claim 10, wherein the photopolymerized material is cured photopolymerized ceramic.

35. The ceramic casting mold of claim 10, wherein the cast component is a turbine blade or a stator vane.

36. The ceramic casting mold of claim 35, further comprising a plurality of cooling hole filaments having a cross sectional area ranging from 0.01 millimeters (mm) to 2 $mm^2$, the plurality of cooling hole filaments joining the main core portion and the shell portion where each of the plurality of cooling hole filaments spans between the main core portion and the shell portion, the plurality of cooling hole filaments adapted to define a plurality of cooling holes in the turbine blade or the stator vane upon removal of the ceramic casting mold.

* * * * *